(12) United States Patent
Kao et al.

(10) Patent No.: US 11,848,373 B2
(45) Date of Patent: Dec. 19, 2023

(54) SEMICONDUCTOR DEVICES AND METHODS OF MANUFACTURE

(71) Applicant: Taiwan Semiconductor Manufacturing Company, Ltd., Hsinchu (TW)

(72) Inventors: Wei-Chih Kao, Taipei (TW); Hsin-Che Chiang, Taipei (TW); Chun-Sheng Liang, Puyan Township (TW); Kuo-Hua Pan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 110 days.

(21) Appl. No.: 17/304,434

(22) Filed: Jun. 21, 2021

(65) Prior Publication Data

US 2022/0328654 A1 Oct. 13, 2022

Related U.S. Application Data

(60) Provisional application No. 63/172,482, filed on Apr. 8, 2021.

(51) Int. Cl.
H01L 29/66 (2006.01)

(52) U.S. Cl.
CPC .............................. *H01L 29/6681* (2013.01)

(58) Field of Classification Search
CPC ......... H01L 29/6681; H01L 21/823431; H01L 21/823437
See application file for complete search history.

(56) References Cited

U.S. PATENT DOCUMENTS

| | | | | |
|---|---|---|---|---|
| 11,515,162 B2 * | 11/2022 | More | ................. | H01L 21/28518 |
| 2020/0075342 A1 * | 3/2020 | Chen | ................. | H01L 21/31144 |
| 2021/0242206 A1 * | 8/2021 | Lin | ................. | H01L 21/823864 |
| 2021/0335674 A1 * | 10/2021 | Lin | ........................ | H01L 29/785 |
| 2021/0408263 A1 * | 12/2021 | Lin | ........................ | H01L 29/0649 |
| 2022/0293599 A1 * | 9/2022 | Chiu | ........................ | H01L 29/0653 |
| 2022/0344491 A1 * | 10/2022 | Tsai | ..................... | H01L 29/6681 |

* cited by examiner

*Primary Examiner* — Christine A Enad
(74) *Attorney, Agent, or Firm* — Harrity & Harrity, LLP

(57) ABSTRACT

A dummy fin described herein includes a low dielectric constant (low-k or LK) material outer shell. A leakage path that would otherwise occur due to a void being formed in the low-k material outer shell is filled with a high dielectric constant (high-k or HK) material inner core. This increases the effectiveness of the dummy fin to provide electrical isolation and increases device performance of a semiconductor device in which the dummy fin is included. Moreover, the dummy fin described herein may not suffer from bending issues experienced in other types of dummy fins, which may otherwise cause high-k induced alternating current (AC) performance degradation. The processes for forming the dummy fins described herein are compatible with other fin field effect transistor (finFET) formation processes and are be easily integrated to minimize and/or prevent polishing issues, etch back issues, and/or other types of semiconductor processing issues.

12 Claims, 24 Drawing Sheets

SEMICONDUCTOR DEVICES AND METHODS OF MANUFACTURE

CROSS-REFERENCE TO RELATED APPLICATION

This Patent Application claims priority to U.S. Provisional Patent Application No. 63/172,482, filed on Apr. 8, 2021, and entitled "SEMICONDUCTOR DEVICES AND METHODS OF MANUFACTURE." The disclosure of the prior Application is considered part of and is incorporated by reference into this Patent Application.

BACKGROUND

A field-effect transistor (FET) is a type of transistor that uses an electric field to control the flow of current. A FET includes three terminals: a source, a gate, and a drain. In operation, a FET controls the flow of current through the application of a voltage to the gate which, in turn, alters conductivity between the drain and the source. A commonly used type of FET is a metal-oxide-semiconductor field-effect transistor (MOSFET). Physically, a FET may be formed as a planar transistor, a finFET, a gate all around (GAA) transistor, or another type of form factor. A MOSFET can be used, for example, as a switch for an electrical signal (e.g., a radio frequency (RF) switch), as an amplifier for an electrical signal (e.g., a low-noise amplifier (LNA)), or in complementary metal oxide semiconductor (CMOS) logic (e.g., static random access memory (SRAM) and another type of memory device), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
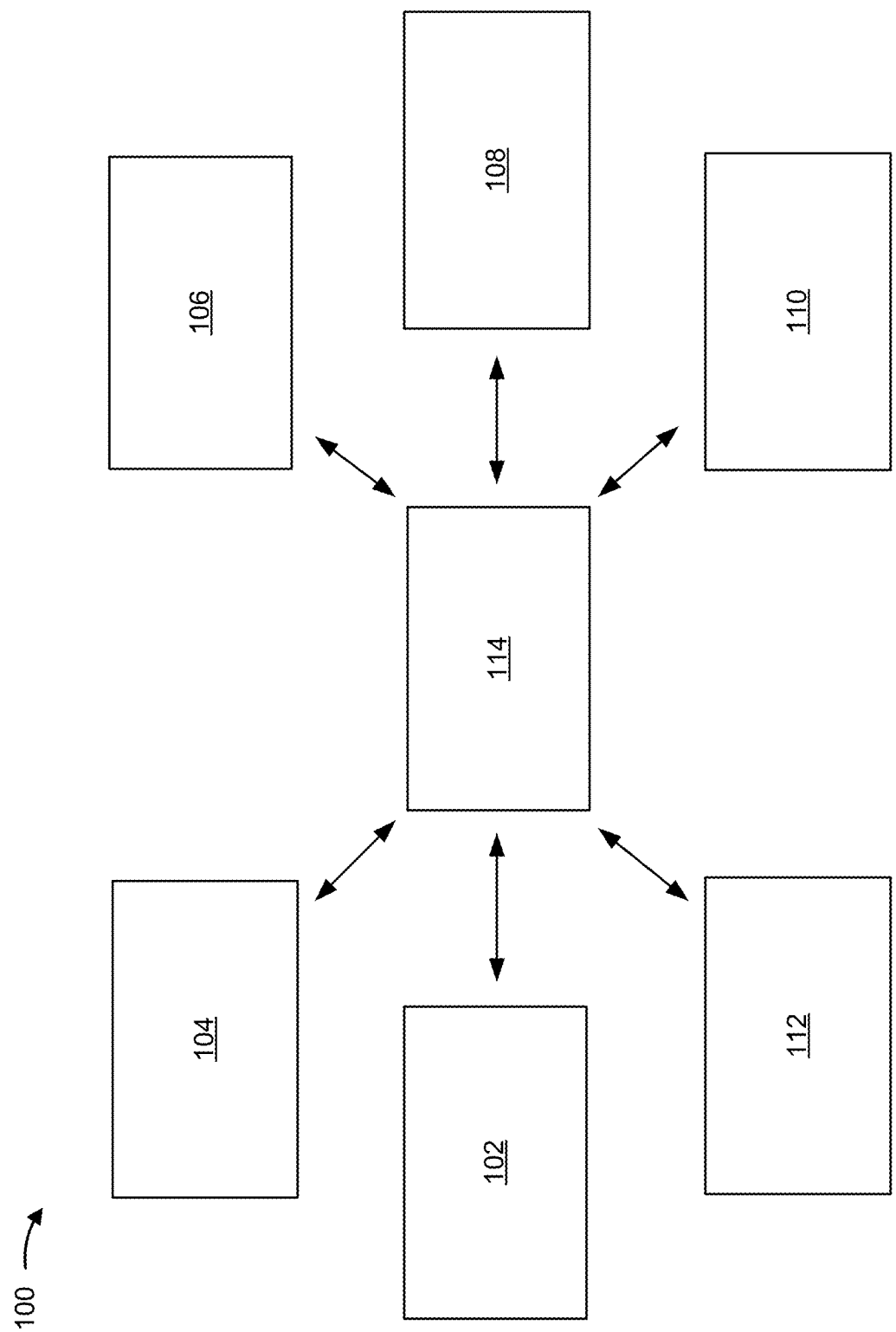
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A dummy fin includes a semiconductor fin structure that is used for electrical isolation of various components of a semiconductor device. As an example, a dummy fin may be included in a semiconductor device that includes transistors to provide gate to gate isolation, epitaxial region to epitaxial region (EPI to EPI) isolation, and/or epitaxial region to gate isolation, among other examples. In some cases, the process of forming a dummy fin (such as by a dielectric merge) may result in the formation of a void (or seam) in the dummy fin. The void may be filled by metal during subsequent gate or drain formation processes. This may result in the formation of a leakage path through the dummy fin, such as a drain to gate leakage path, a gate to gate leakage path, or a drain to drain leakage path, among other examples. The leakage path through the dummy fin reduces the effectiveness of the dummy fin to provide electrical isolation, which decreases device performance of a semiconductor device in which the dummy fin is included.

Some implementations described herein provide a dummy fin that is configured to block a leakage path in a semiconductor device. In some implementations, a dummy fin described herein includes a low dielectric constant (low-k or LK) material outer shell. A leakage path that would otherwise occur due to a void being formed in the low-k material outer shell is filled with a high dielectric constant (high-k or HK) material inner core. This increases the effectiveness of the dummy fin to provide electrical isolation and increases device performance of a semiconductor device in which the dummy fin is included. Moreover, the dummy fin described herein may not suffer from bending issues experienced in other types of dummy fins, which may otherwise cause high-k induced alternating current (AC) performance degradation. The processes for forming the dummy fins described herein are compatible with other fin field effect transistor (finFET) formation processes and are easily integrated to minimize and/or prevent polishing issues, etch back issues, and/or other types of semiconductor processing issues.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is used to transport wafers and/or dies between semiconductor processing tools 102-112 and/or to and from other locations such as a wafer rack, a storage room, and/or the like. In some implementations, wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2A-2D are diagrams of an example semiconductor device 200 described herein. The semiconductor device 200 is an example of a semiconductor device that includes a plurality of transistors, such as a memory device (e.g., a static random access memory (SRAM), a dynamic random access memory (DRAM)) or a logic device (e.g., a processor, an application specific integrated circuit (ASIC)), among other examples.

Figure 2A:
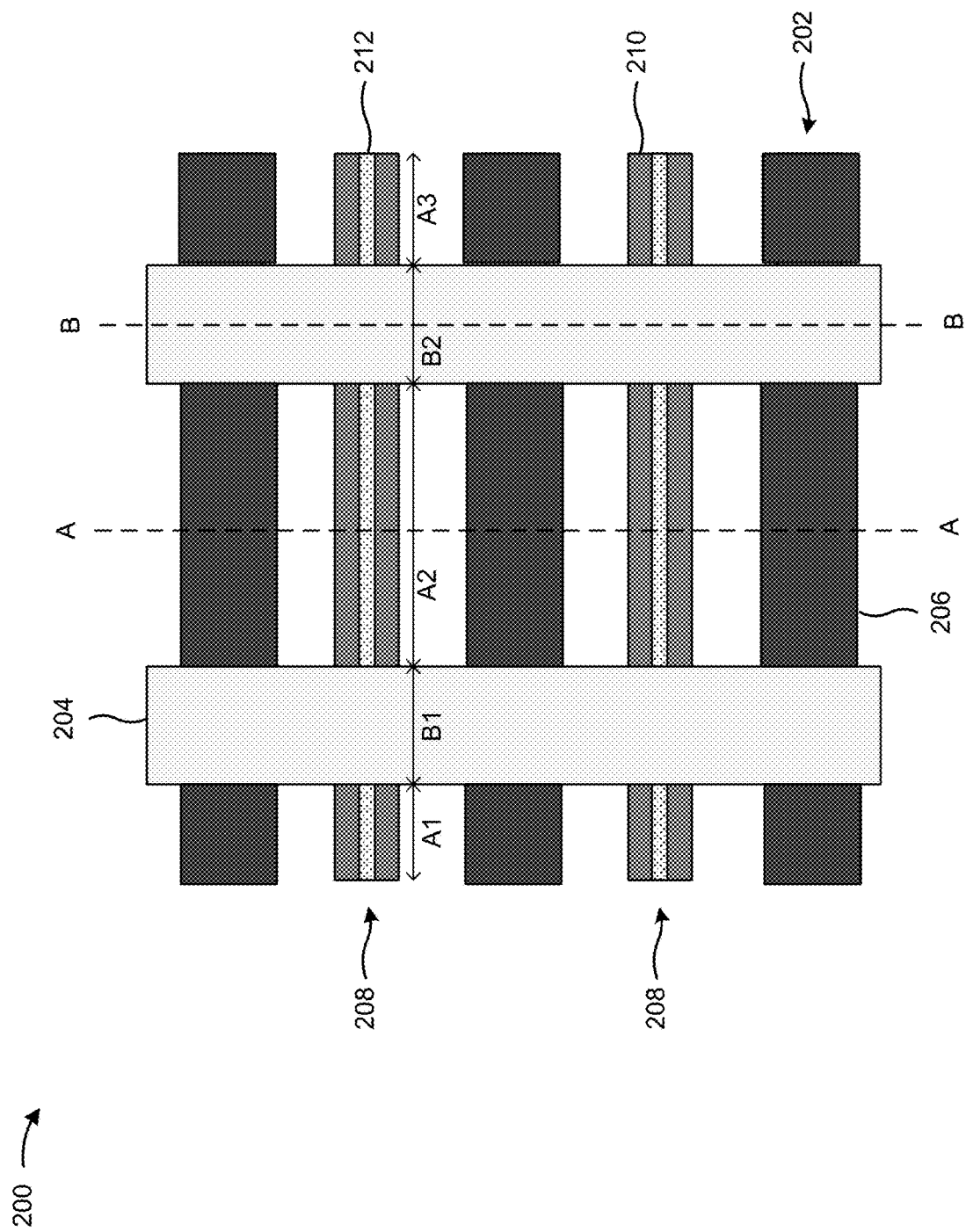
FIGS. 2A-2D are diagrams of an example semiconductor device described herein.

As shown in a top-down view in FIG. 2A, the semiconductor device 200 includes a plurality of active fins 202. The active fins 202 include silicon (Si) fins, silicon germanium (SiGe) fins, and/or fins that are formed of other types of semiconductive materials. The active fins 202 are arranged in an approximately parallel configuration in which the active fins 202 extend in a first direction of the semiconductor device 200. A portion of each active fin 202 may function as a switching channel for a transistor included in the semiconductor device 200. Accordingly, in some implementations, the transistors included in the semiconductor device include finFETs.

The semiconductor device 200 includes one or more gates 204 of the transistors included in the semiconductor device 200. The one or more gates 204 extend in a second direction that is approximately perpendicular to the first direction of the active fins 202. Moreover, the one or more gates 204 surround portions of the active fins 202 on at least three sides of the active fins 202 to provide increased switching channel control of the transistors included in the semiconductor device 200. The one or more gates 204 include polysilicon (PO) gates or gates formed of another material. In some implementations, the semiconductor device 200 includes a plurality of gates 204 that extend approximately parallel to one another in the second direction.

Epitaxial regions 206 are included on portions of the active fins 202 that are not covered by the one or more gates 204. The epitaxial regions 206 function as source or drain regions for the transistors included in the semiconductor device 200. In some implementations, an epitaxial region 206 is located between two gates 204. In some implementations, an epitaxial region 206 is located adjacent to a single gate 204.

The semiconductor device 200 includes one or more dummy fins 208 that are configured to provide electrical isolation between one or more structures and/or components included in the semiconductor device 200. In some implementations, a dummy fin 208 is configured to provide electrical isolation between two or more active fins 202. In some implementations, a dummy fin 208 is configured to provide electrical isolation between two or more epitaxial regions 206. In some implementations, a dummy fin 208 is configured to provide electrical isolation between two or more gates 204. In some implementations, a dummy fin 208 is configured to provide electrical isolation between an epitaxial region 206 and a gate 204.

A dummy fin 208 includes a fin structure that extends in the first direction approximately parallel to the active fins 202. In some implementations, a dummy fin 208 is included between two active fins 202 and extends approximately the same length as the two active fins 202. In some implementations, the semiconductor device 200 includes a plurality of dummy fins 208, where the active fins 202 and the dummy fins 208 are arranged in an alternating configuration as shown in FIG. 2A.

A dummy fin 208 described herein includes a plurality of types of dielectric materials. A dummy fin 208 includes a shell 210 that includes a low-k dielectric material and a core 212 that includes a high-k dielectric material. The core 212 fills a void that occurs during the formation of the shell 210 such that a leakage path through the dummy fin 208, that would otherwise occur if the void is filled with metal when the contacts for the epitaxial regions 206 and/or the gate(s) 204 are formed, is filled with a high-k dielectric material. In other words, the void is filled with the high-k material core 212 to block or prevent the core 212 from being filled with the metal of the contacts for the epitaxial regions 206 and/or the gate(s) 204 to prevent the leakage path from forming through the dummy fin 208.

The core 212 is at least partially surrounded by the shell 210 along the length of the dummy fin 208 in the first direction. In particular, the core 212 is surrounded by the shell 210 on three sides of the core 212 in portions A1, A2, and A3 that are not covered or surround by a gate 204. In these portions, the core 212 is not covered or surrounded by the shell 210 in a top portion of the dummy fin 208, as illustrated in FIG. 2A. The core 212 is surrounded by the shell 210 on four sides of the core 212 (e.g., such that the shell 210 completely surrounds the core 212) in portions B1 and B2 under gates 204. This occurs due to the shell 210 being formed prior to formation of the gate(s) 204, and due to the void in the dummy fin 208 being opened and filled with the core 212 after formation of the gate(s) 204.

In some implementations, width of the portion of the core 212 that is not covered by the shell 210 in the top portion of the dummy fin 208 is less than a width of the portion of the dummy fin 208. In other words, the top portion of the dummy fin 208 is shared by the shell 210 and the core 212. In some implementations, the portion of the core 212 that is not covered by the shell 210 in the top portion of the dummy fin 208 occupies less surface area of the top portion of the dummy fin 208 than the shell 210.

The low-k dielectric material of the shells 210 of the dummy fins 208 included in the semiconductor device 200 include silicon carbon nitride (SiCN), silicon nitride (SiN), a low-k oxide material, a low-k nitride material, a low-k oxy-nitride material, a low-k nitride, a low-k carbon, a low-k combination of oxide, nitride, and carbon, and/or another type of low-k dielectric material. In some implementations, one or more of the shells 210 of the dummy fins 208 included in the semiconductor device 200 are formed of a high-k dielectric material instead of a low-k dielectric material. The high-k dielectric material of the cores 212 of the dummy fins 208 included in the semiconductor device 200 include a hafnium oxide ($HfO_x$), a zirconium oxide ($ZrO_x$), an aluminum oxide ($Al_xO_y$), a lanthanum oxide ($La_xO_y$), a high-k oxide, a high-k nitride, a high-k oxy-nitride, and/or another high-k dielectric material.

Figure 2B:
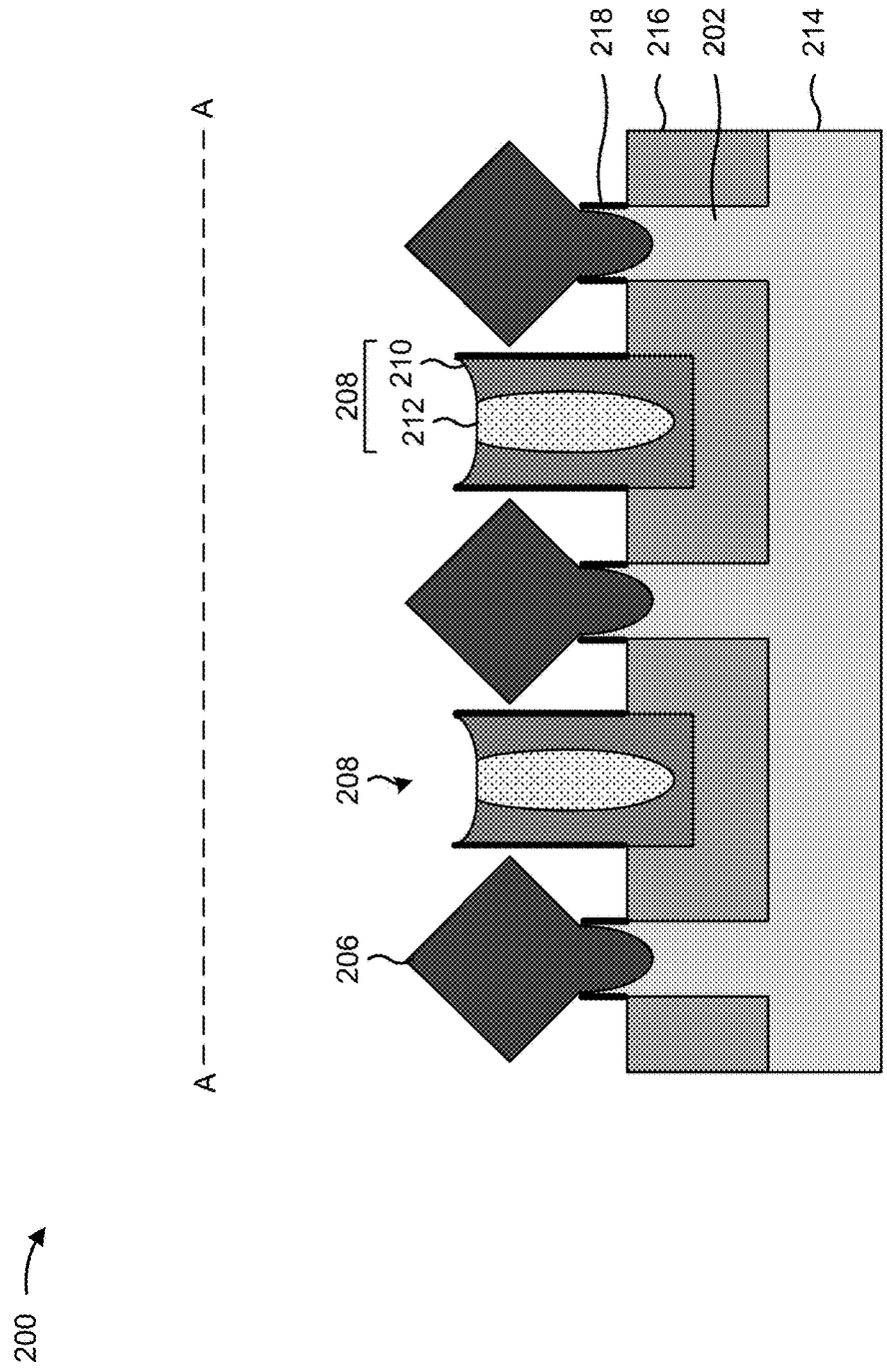

FIG. 2B illustrates a cross-sectional elevation view along line AA of FIG. 2A. The cross-sectional elevation view along the line AA illustrates various details of the active fins 202, the epitaxial regions 206, and the dummy fins 208 in a portion of the semiconductor device 200 along the second direction between the gates 204.

As shown in FIG. 2B, the active fins 202 extend from a substrate 214 of the semiconductor device 200. The areas between the active fins 202 (and the areas between the dummy fins 208 and the substrate 214) are filled with shallow trench isolation (STI) regions 216. The STI regions 216 provide electrical isolation between the active fins 202 and include a dielectric material such as a silicon oxide ($SiO_x$) and/or another dielectric material. A gate spacer 218 is included on portions of the active fins 202, portions of the dummy fins 208, and portions of the STI regions 216.

As further shown in FIG. 2B, portions of the epitaxial regions 206 are filled in recessed portions of the active fins 202, and the remaining portions of the epitaxial regions 206 extend above the active fins 202. The epitaxial regions 206 may alternatively be referred to as strained or raised source or drain regions. The epitaxial regions 206 are formed in the recessed portions of the active fins 202 by an epitaxy or epitaxial (epi) process. In some implementations, the epi process includes a selective epitaxy growth (SEG) process, CVD deposition techniques (e.g., vapor-phase epitaxy (VPE) and/or ultra-high vacuum CVD (UHV-CVD)), molecular beam epitaxy, and/or another suitable epi process. The epi process includes the use gaseous and/or liquid precursors, which interact with the composition of active fins 202. The deposited semiconductor material is different from the semiconductor material of the active fins 202. Accordingly, channel regions of the semiconductor device 200 along the active fins are strained or stressed to enable carrier mobility in the semiconductor device 200 to enhance device performance.

As further shown in FIG. 2B, the dummy fins 208 are located between the active fins 202 (and between the epitaxial regions 206) to provide electrical isolation between the active fins 202 (and between the epitaxial regions 206). The cross-sectional view in FIG. 2B illustrates the portion A2 of the dummy fins 208 in which the cores 212 of the dummy fins 208 are surrounded by the shells 210 of the dummy fins 208 on three sides of the cores 212. This occurs because the tops of the shells 210 of the dummy fins 208 are etched to expose the voids in the shells 210 in the portions A1, A2, and A3 so that the voids can be filled with the high-k dielectric material of the cores 212 to close any leakage paths that might otherwise form as a result of the voids, as described in greater detail herein.

Figure 2C:
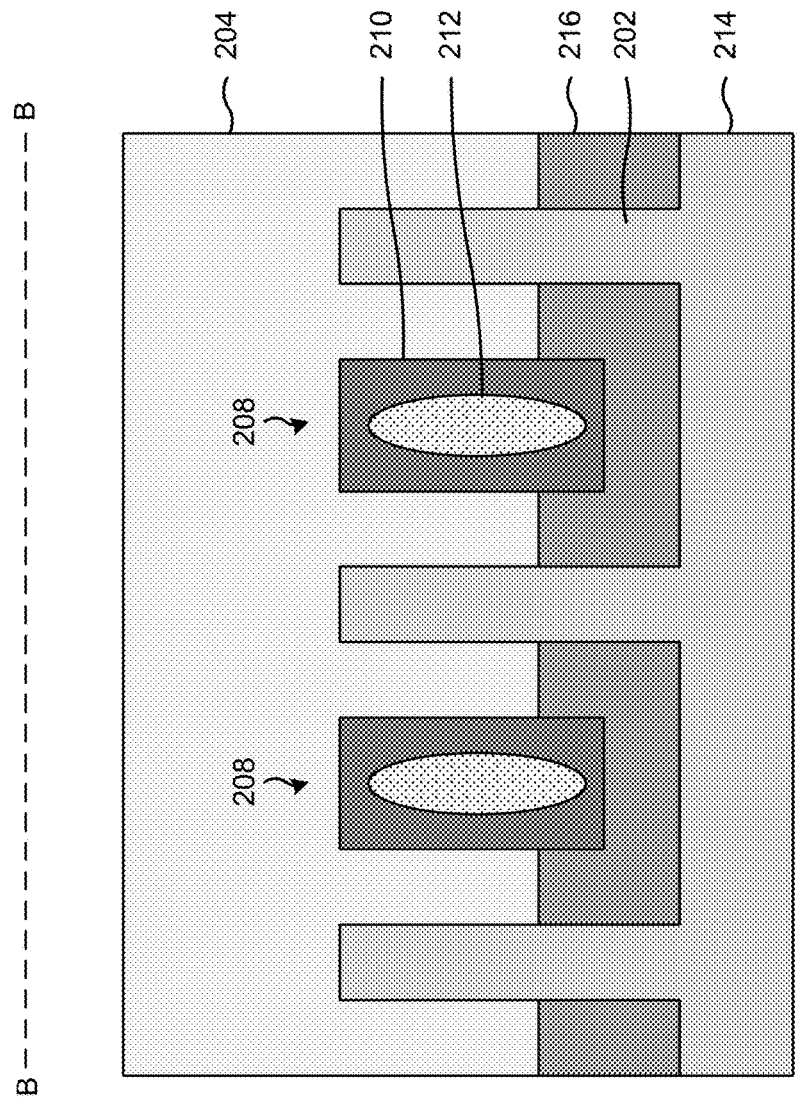

FIG. 2C illustrates another cross-sectional elevation view along line BB of FIG. 2A. The cross-sectional elevation view along the line BB illustrates various details of the active fins 202, the dummy fins 208, and the gates 204 in a portion of the semiconductor device 200 along a gate 204 in the second direction.

As shown in FIG. 2C, the gate 204 surrounds each active fin 202 and each dummy fin 208 on three sides. This increases the control of the gate 204 over the switching channels through the active fins 202. As further shown in FIG. 2C, the shells 210 of the dummy fins 208 completely surround the cores 212 of the dummy fins 208 and all four sides of the cores 212 under the gate 204. This occurs because the shells 210 of the dummy fins 208 are formed prior to formation of the gate 204, and thus the portions of the shells 210 under the gate 204 are not etched to fill the voids in the shells 210. However, the high-k material that is used to fill the voids and form the cores 212 travels into the voids under the gate 204 such that the core 212 is formed in the portions of the dummy fins 208 under the gate 204.

Figure 2D:
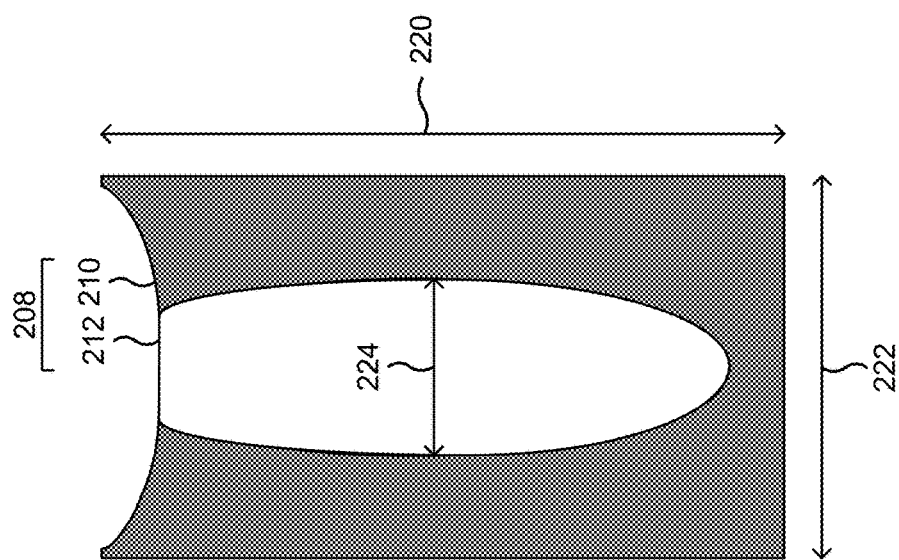

FIG. 2D illustrates example dimensions of a dummy fin 208. As shown in FIG. 2D, an example dimension of a dummy fin 208 includes a height 220 of the dummy fin 208 (and thus, the height of the shell 210). In some implementations, the height 220 is in a range of approximately 50 nanometers to approximately 70 nanometers to provide sufficient electrical isolation and leakage protection for the semiconductor device 200. However, other values for the height 220 are within the scope of the present disclosure.

As further shown in FIG. 2D, an example dimension of a dummy fin 208 includes a width 222 of the dummy fin 208 (and thus, the width of the shell 210). In some implementations, the width 222 is in a range of approximately 5 nanometers to approximately 15 nanometers to provide sufficient electrical isolation and leakage protection for the semiconductor device 200. However, other values for the width 222 are within the scope of the present disclosure.

As further shown in FIG. 2D, an example dimension of a dummy fin 208 includes a width 224 of the core 212. The width 224 includes a width of the core 212 at a widest point of the core 212. In some implementations, the width 224 is in a range of approximately 1 nanometer to approximately 3 nanometers to fill the void in the shell 210, to provide sufficient electrical isolation and leakage protection for the semiconductor device 200, and so that residual high-k dielectric material can be removed. However, other values for the width 224 are within the scope of the present disclosure.

As indicated above, FIGS. 2A-2D are provided as an example. Other examples may differ from what is described with regard to FIGS. 2A-2D.

Figure 3A:
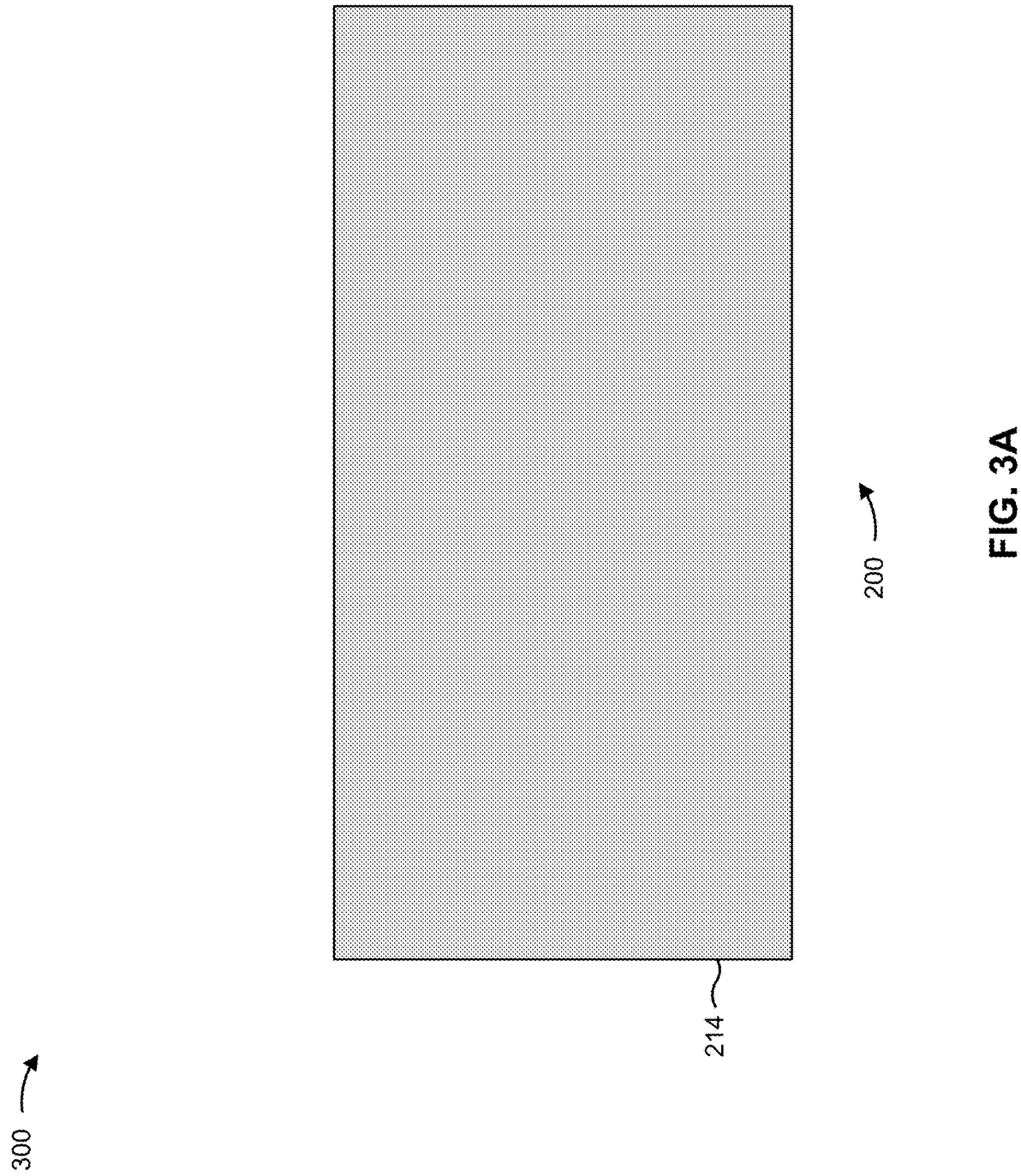
FIGS. 3A-3G, 4A-4F, and 5A-5C are diagrams of example implementations described herein.

FIGS. 3A-3G are diagrams of an example implementation 300 described herein. The example implementation 300 includes an example of forming a portion of the semiconductor device 200 described herein. Turning to FIG. 3A, the semiconductor device 200 is formed in and/or on the substrate 214. The substrate 214 is formed of a material including silicon, a III-V compound semiconductor material substrate such as gallium arsenide (GaAs) or silicon germanium (SiGe), a silicon on insulator (SOI) substrate, or another type of semiconductor substrate.

Figure 3B:
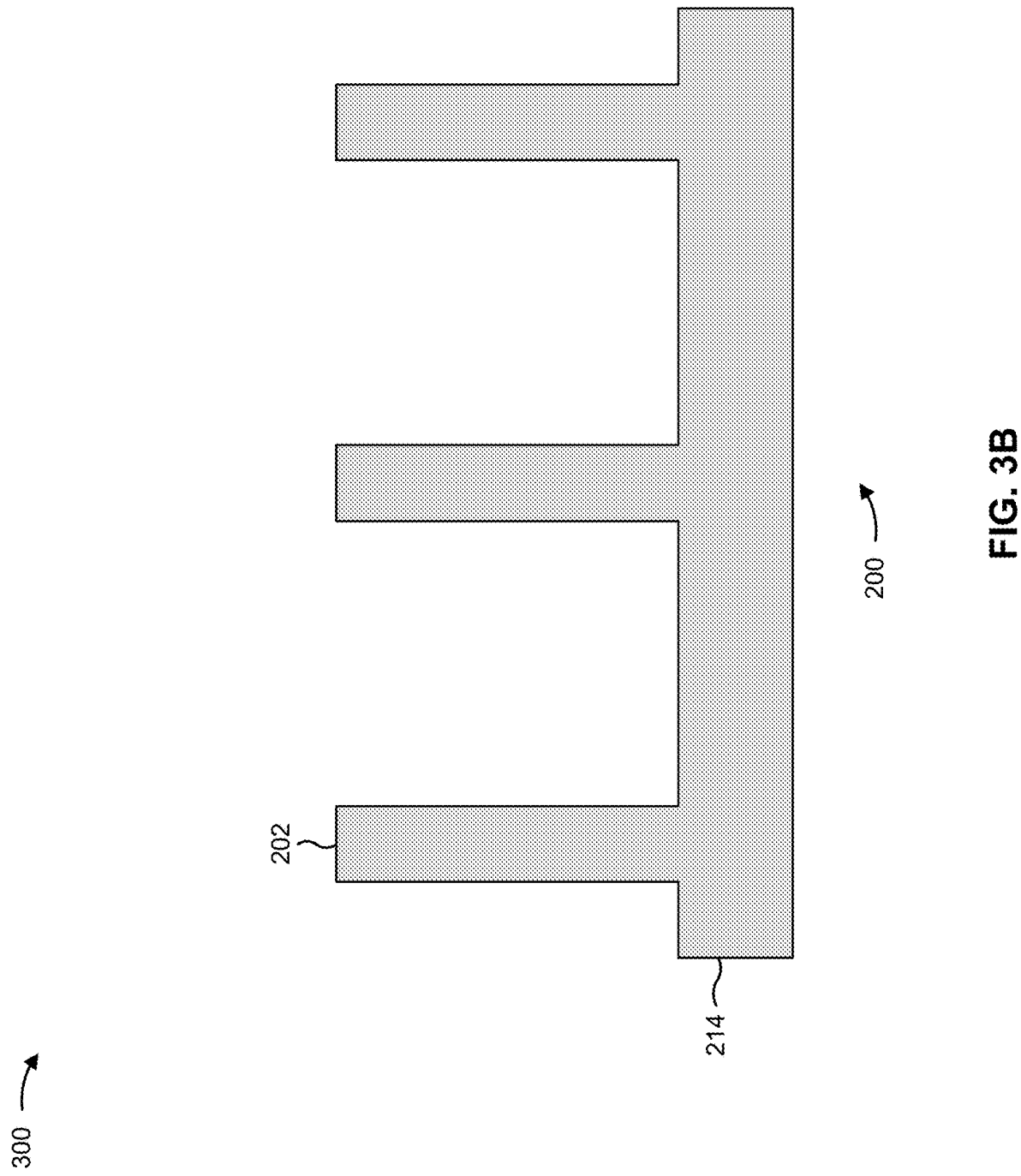

As shown in FIG. 3B, a plurality of portions of the substrate 214 are removed to form the active fins 202. In some implementations, a pattern in a photoresist layer is used to form the active fins 202. In these implementations, the deposition tool 102 forms the photoresist layer on the substrate 214. The exposure tool 104 exposes the photoresist layer to a radiation source to pattern the photoresist layer. The developer tool 106 develops and removes portions of the photoresist layer to expose the pattern. The etch tool 108 etches into the substrate 214 based on the pattern to form the active fins 202. In some implementations, the etch operation includes a plasma etch technique, a wet chemical etch technique, and/or another type of etch technique. The etch tool 108 may form the active fins 202 using one or more etching operations. In some implementations, a photoresist removal tool removes the remaining portions of the photoresist layer (e.g., using a chemical stripper, plasma ashing, and/or another technique). In some implementations, a hard mask layer is used as an alternative technique for forming the active fins 202 based on a pattern.

Figure 3C:
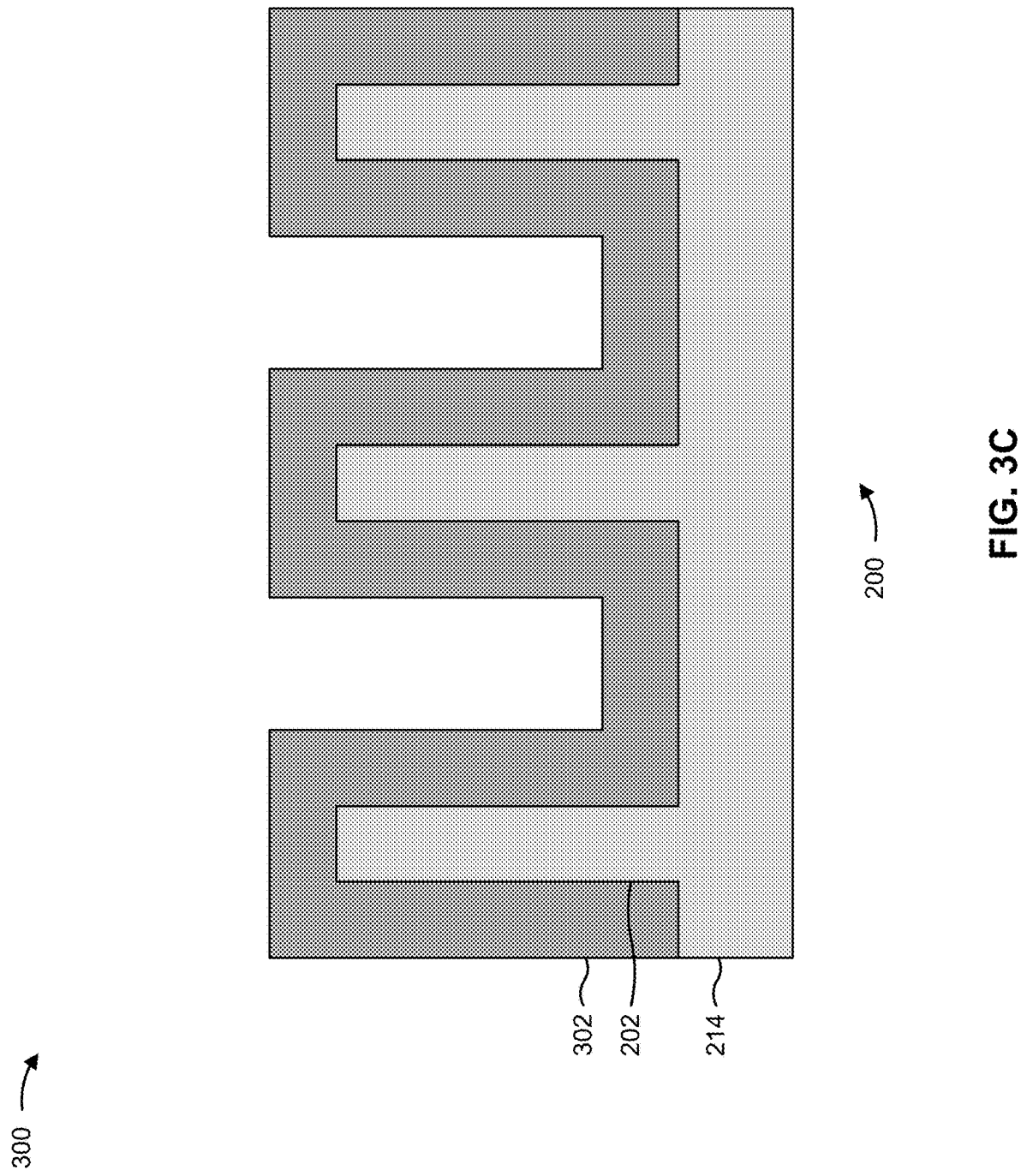

As shown in FIG. 3C, a dielectric layer 302 is formed over and/or on substrate 214 and over and/or on the active fins 202. The deposition tool 102 deposits the dielectric layer 302 by a CVD technique, a PVD technique, an ALD technique, or another type of deposition technique described above in connection with FIG. 1. In some implementations, the dielectric layer 302 is conformally deposited on the active fins 202 such that the dielectric layer 302 is formed on the tops and sidewalls of the active fins 202.

Figure 3D:
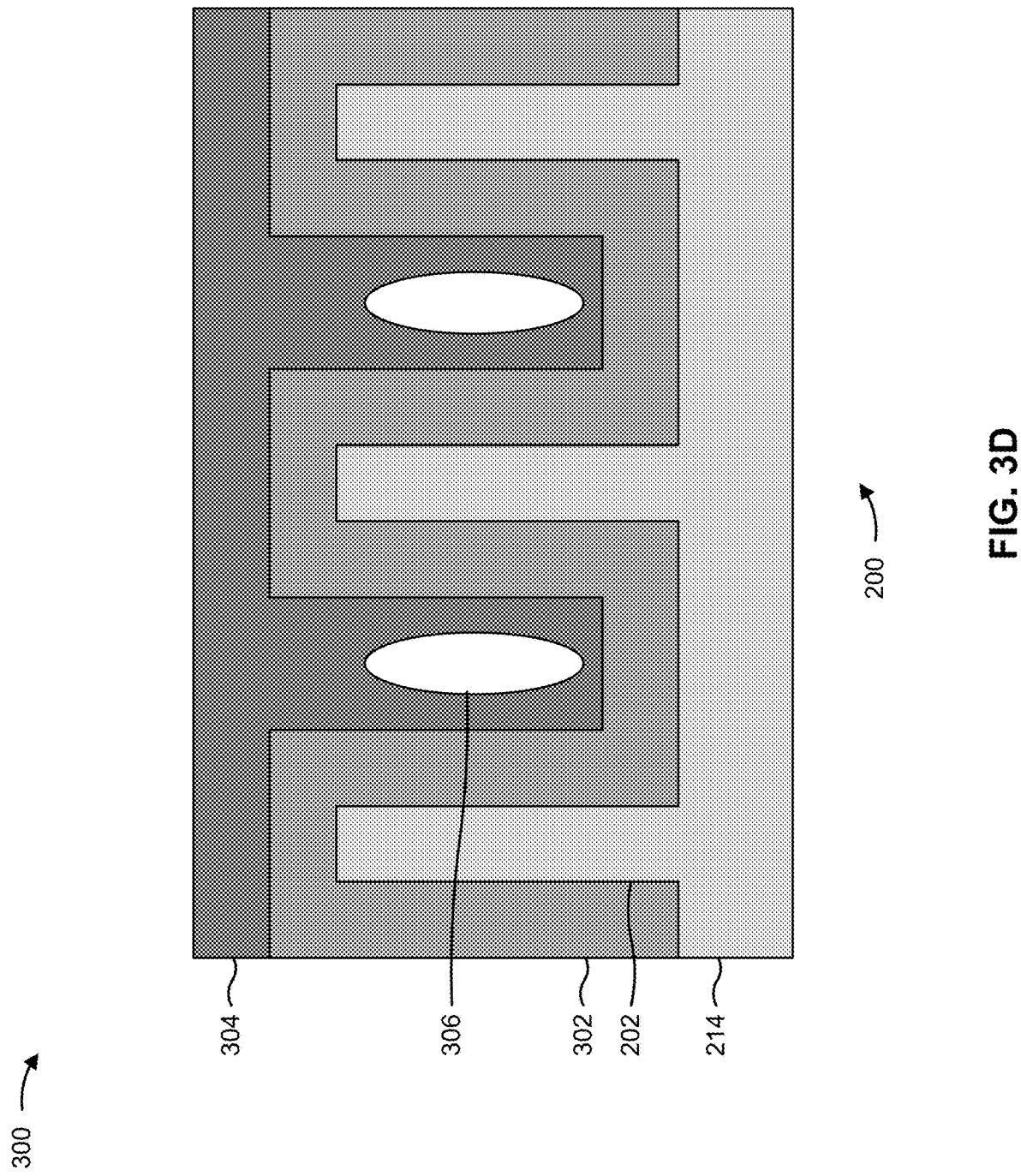

As shown in FIG. 3D, a low-k dielectric material layer 304 is formed in openings in the dielectric layer 302 between the active fins 202. The deposition tool 102 deposits the low-k dielectric material layer 304 by a CVD technique, a PVD technique, an ALD technique, or another type of deposition technique described above in connection with FIG. 1. In some implementations, the low-k dielectric material layer 304 is formed by a dielectric merge operation in which separate portions of the low-k dielectric material layer 304 are merged together. As further shown in FIG. 3D, voids 306 form in the low-k dielectric material layer 304 during formation of the low-k dielectric material layer 304. In particular, the voids 306 form in the areas between the active fins 202.

Figure 3E:
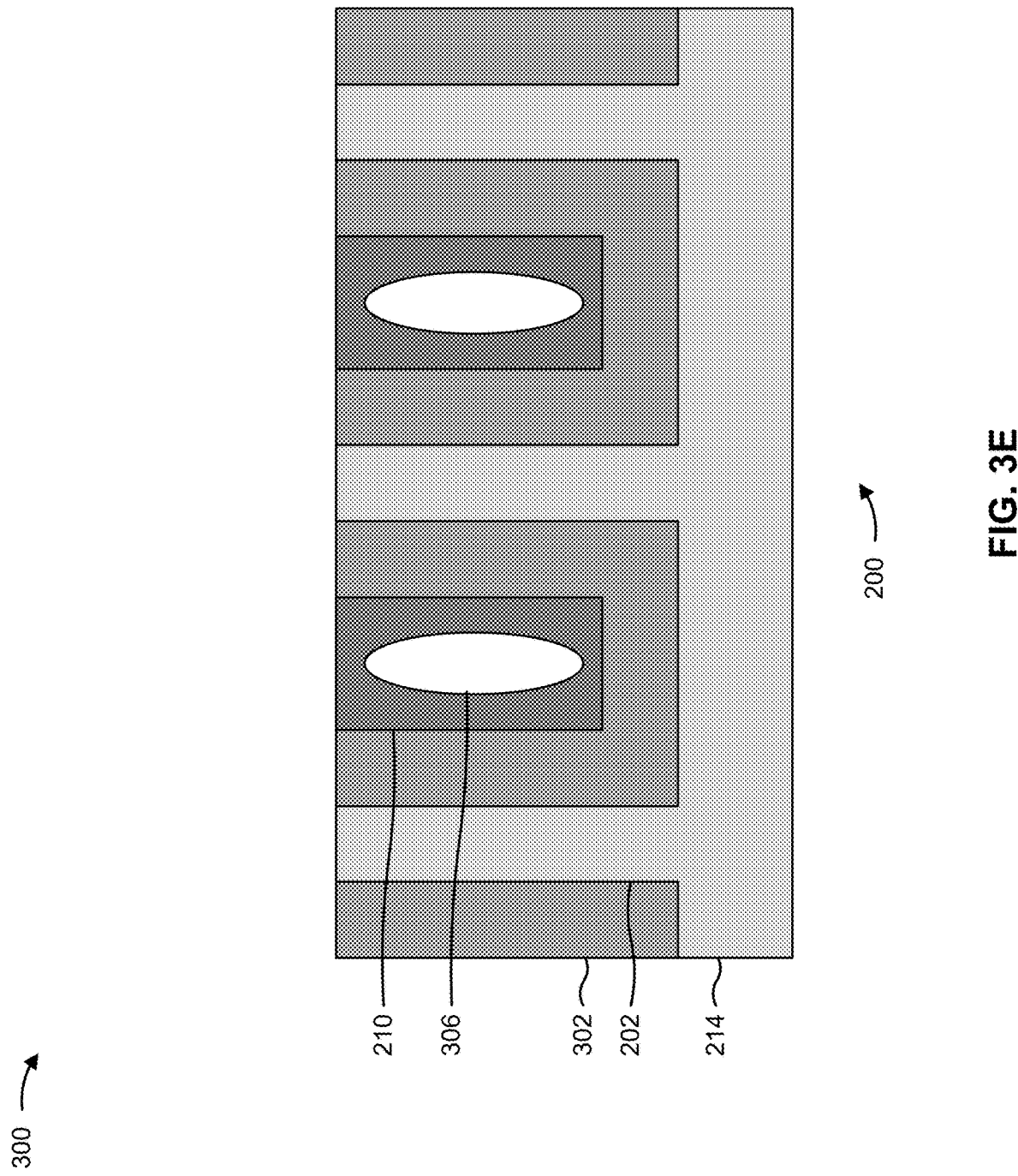

As shown in FIG. 3E, portions of the dielectric layer 302 and portions of the low-k dielectric material layer 304 are removed to form the STI regions 216 and the shells 210 of the dummy fins 208. In particular, the planarization tool 110 performs a planarization or polishing operation to remove the portions of the dielectric layer 302 and the portions of the low-k dielectric material layer 304. In some implementations, the planarization tool 110 removes the portions of the dielectric layer 302 and the portions of the low-k dielectric material layer 304 to expose the tops of the active fins 202.

Figure 3F:
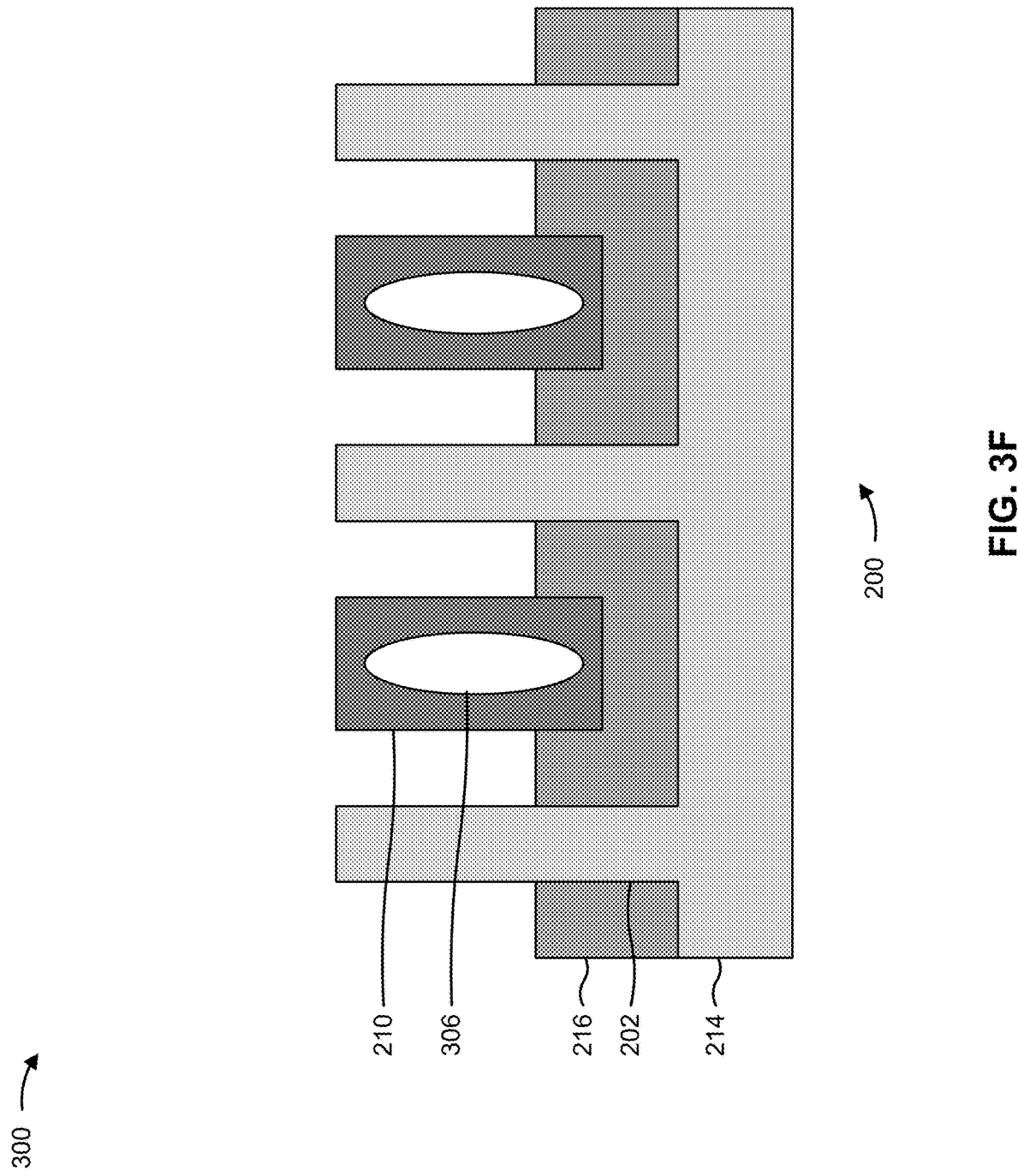

As shown in FIG. 3F, the height or depth of the STI regions 216 is reduced in an etch-back operation. In this way, portions of the active fins 202 are exposed so that the epitaxial regions 206 can be formed on the exposed portion of the active fins 202. In some implementations, a pattern in a photoresist layer is used to etch back the STI regions 216. In these implementations, the deposition tool 102 forms the photoresist layer on the active fins 202 and on the shells 210 of the dummy fins 208. The exposure tool 104 exposes the photoresist layer to a radiation source to pattern the photoresist layer. The developer tool 106 develops and removes portions of the photoresist layer to expose the pattern. The etch tool 108 etches the STI regions 216 based on the pattern to reduce the height or depth of the STI regions 216. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for etching back the STI regions 216 based on a pattern.

Figure 3G:
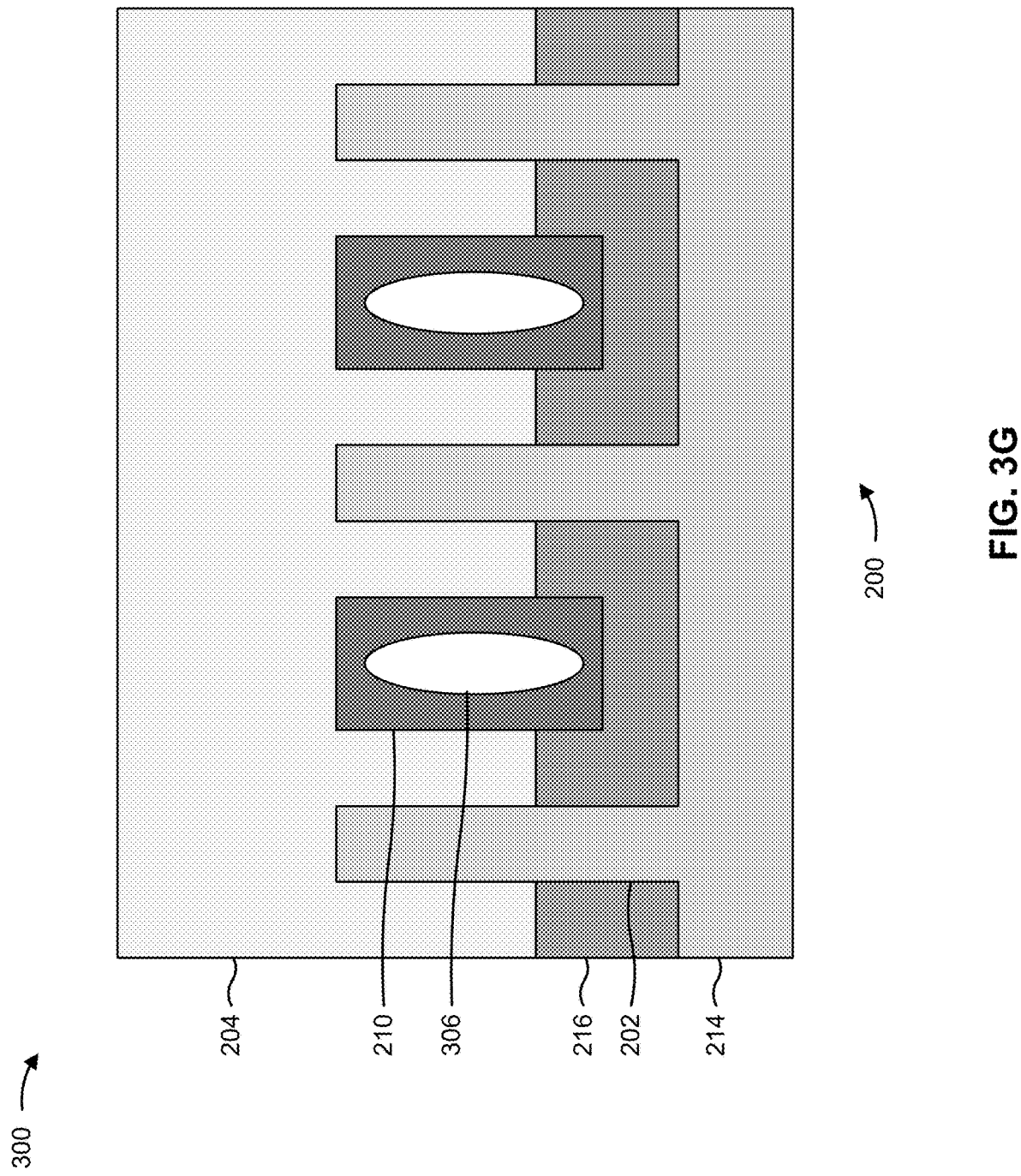

As shown in FIG. 3G, a gate 204 is formed over and/or on the active fins 202 such that the gate 204 surrounds the active fins 202 on three sides of the active fins 202. Moreover, the gate 204 is formed over and/or on the shells 210 of the dummy fins 208 such that the gate surrounds the shells 210 on three sides of the shells 210. The deposition tool 102 deposits the gate 204 by a CVD technique, a PVD technique, an ALD technique, or another type of deposition technique described above in connection with FIG. 1.

As indicated above, FIGS. 3A-3G are provided as an example. Other examples may differ from what is described with regard to FIGS. 3A-3G.

Figure 4A:
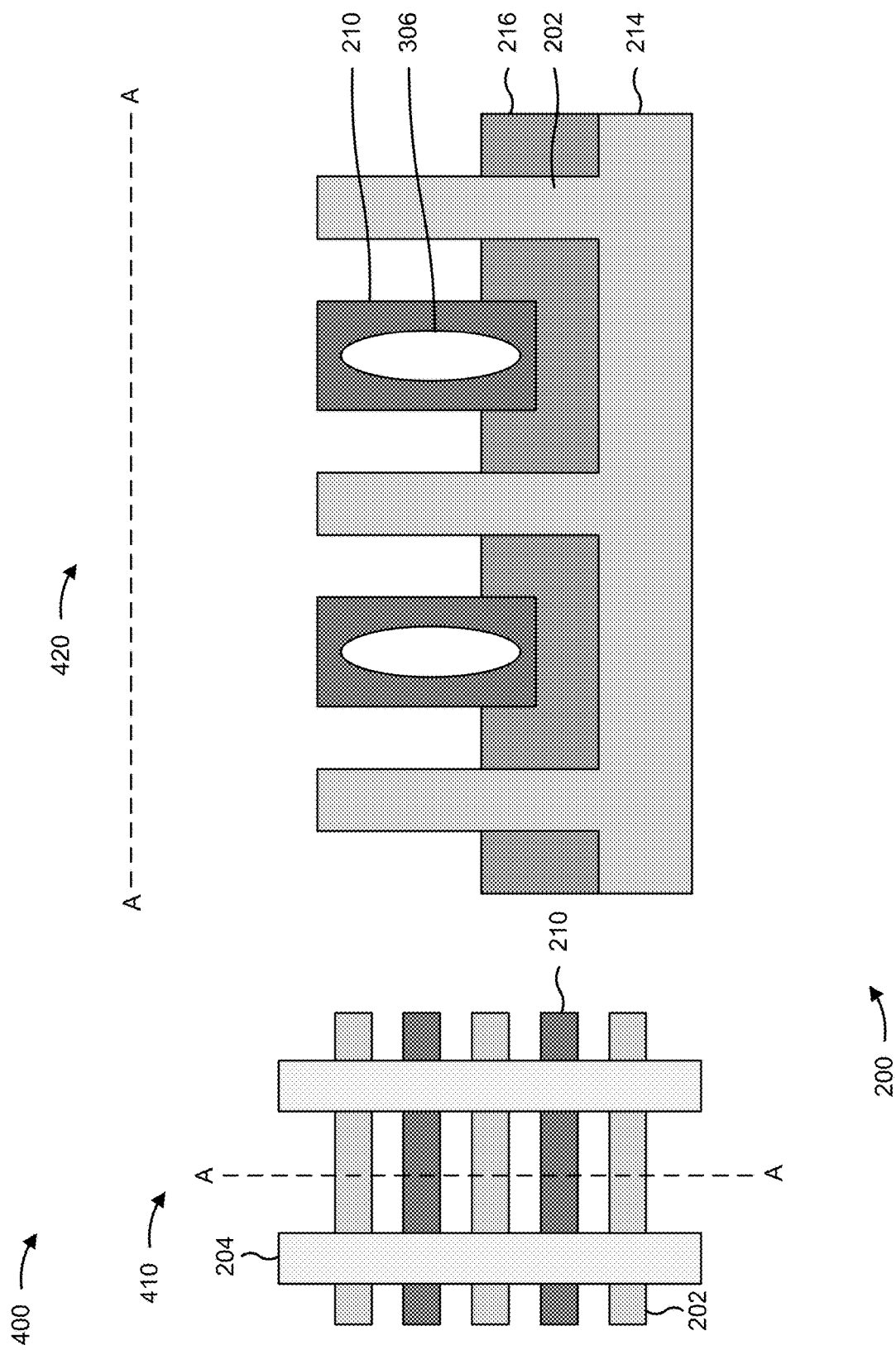

FIGS. 4A-4F are diagrams of an example implementation 400 described herein. The example implementation 400 includes an example of forming a portion of the semiconductor device 200 described herein. FIGS. 4A-4F illustrate the example implementation 400 in a top-down view 410 of the semiconductor device 200 and a cross-sectional elevation view 420 along the line AA (e.g., in a portion of the semiconductor device 200 that is not covered by a gate 204). Turning to FIG. 4A, the operations of the example implementation 400 described in connection with FIGS. 4A-4F are performed after the operations of the example implementation 300 described in connection with FIGS. 3A-3G.

Figure 4B:
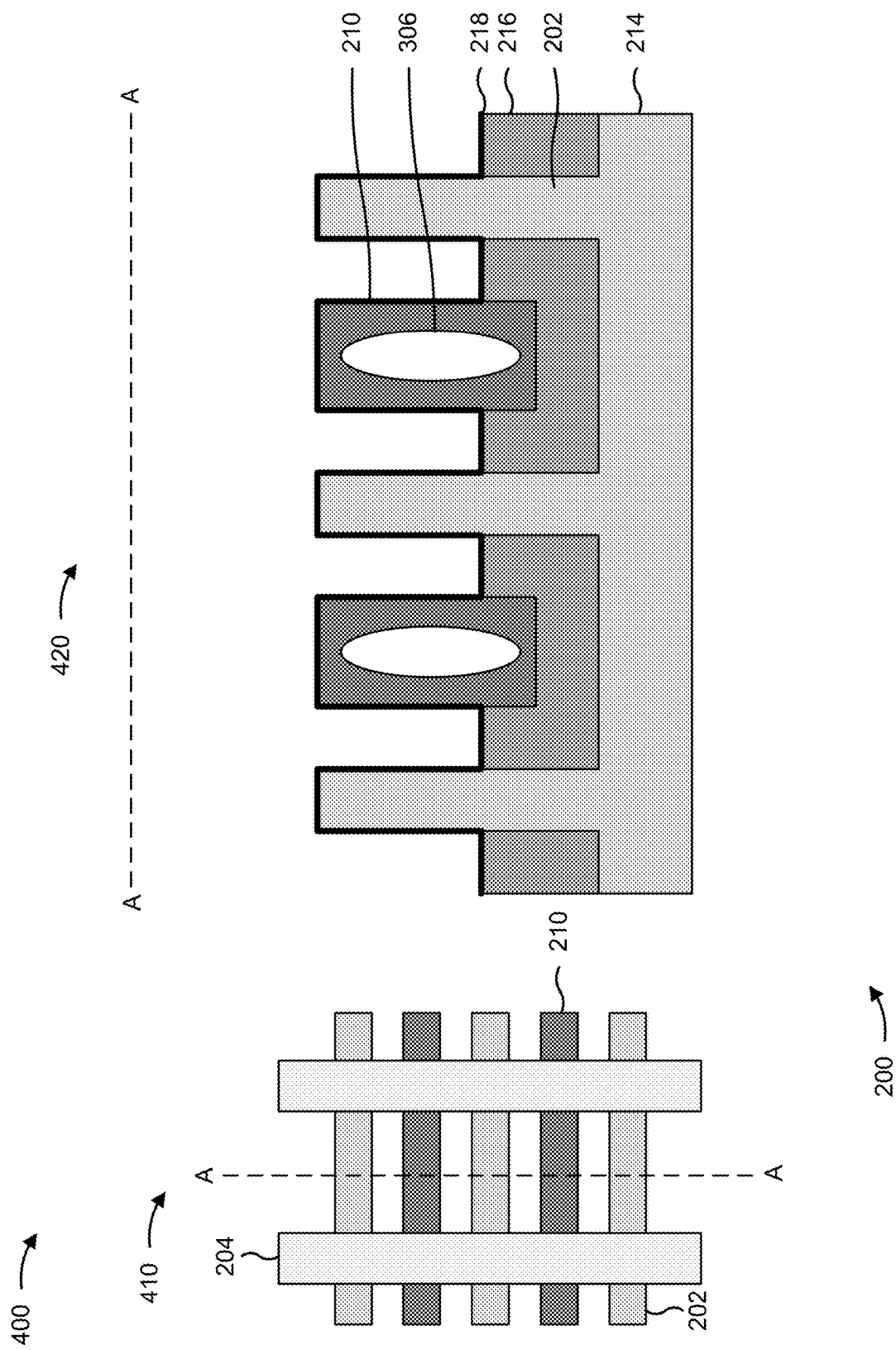

As shown in FIG. 4B, the gate spacer 218 is formed over and/or on portions of the active fins 202, portions of the shells 210 of the dummy fins 208, and portions of the STI regions 216. The deposition tool 102 deposits the gate spacer 218 by a CVD technique, a PVD technique, an ALD technique, or another type of deposition technique described above in connection with FIG. 1. As shown in FIG. 4B, the gate spacer 218 is conformally deposited on the portions of the active fins 202, the portions of the shells 210 of the dummy fins 208, and the portions of the STI regions 216.

Figure 4C:
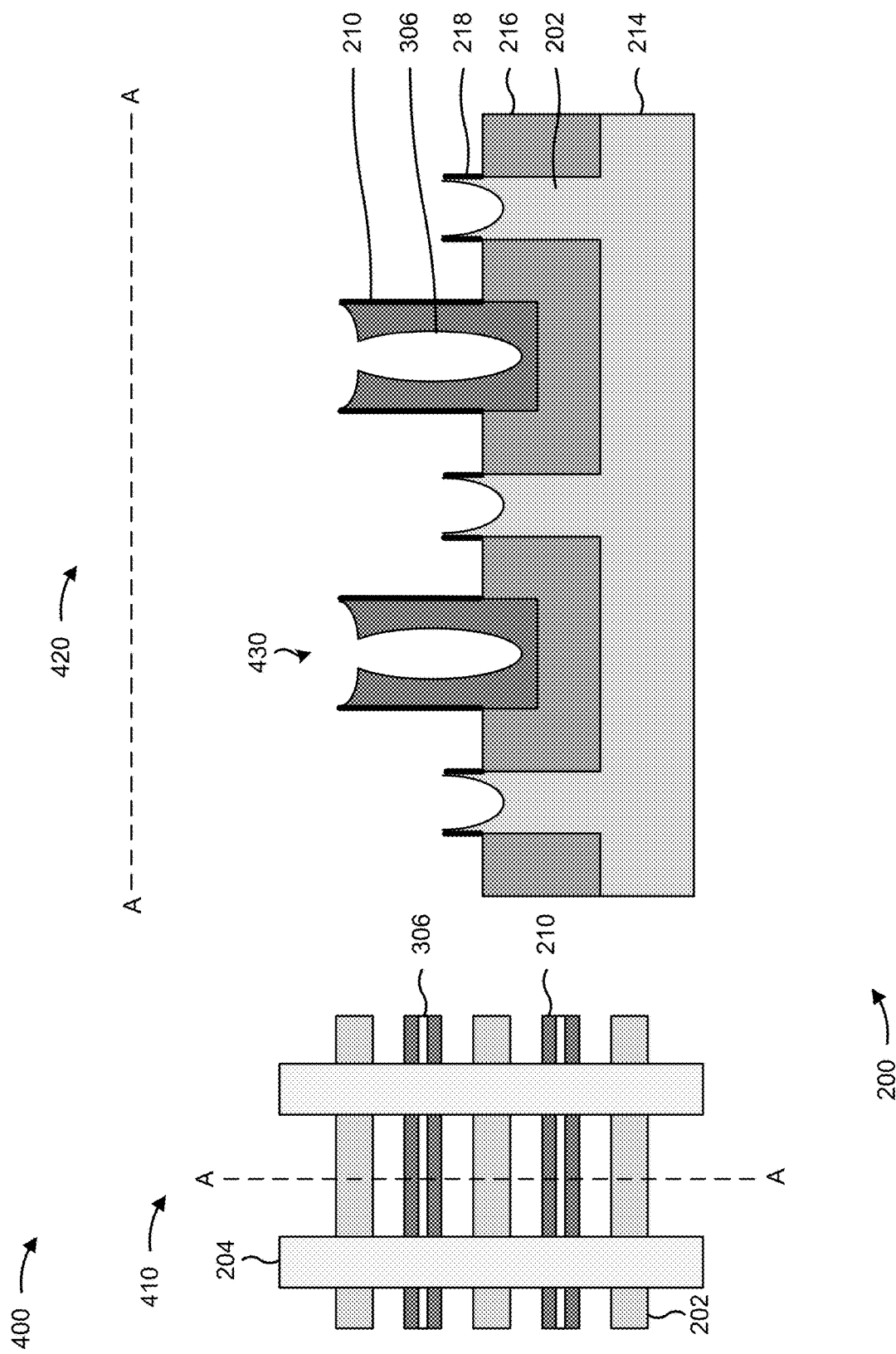

As shown in FIG. 4C, a strained source drain (SSD) etch operation is performed to form recesses in the active fins 202. The tops of the shells 210 of the dummy fins 208 are also etched in the SSD etch operation. The tops of the shells 210 are etched to form openings 430 to the voids 306 in the shells 210. In particular, the openings 430 are formed in the shells 210 of the dummy fins 208 in the portions along the dummy fins 208 that are not covered by the gates 204, as shown in the top-down view 410 in FIG. 4C. The openings 430 are formed to open and/or expose the voids 306 in the shells 210 so that the voids 306 can be filled with a high-k dielectric material. By filling the voids 306 with the high-k dielectric material, the voids 306 are closed which prevents leakage paths from being formed in the voids 306 in one or more subsequent metal deposition processes.

In some implementations, a pattern in a photoresist layer is used to form the recesses in the active fins 202 and to form the openings 430 in the shells 210 of the dummy fins 208. In these implementations, the deposition tool 102 forms the photoresist layer on the gate spacer 218. The exposure tool 104 exposes the photoresist layer to a radiation source to pattern the photoresist layer. The developer tool 106 devel-ops and removes portions of the photoresist layer to expose the pattern. The etch tool 108 etches into the gate spacer 218, into the tops of the active fins 202, and into the tops of the shells 210 of the dummy fins 208 based on the pattern. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses the active fins 202 and the openings 430 in the shells 210 based on a pattern.

Figure 4D:
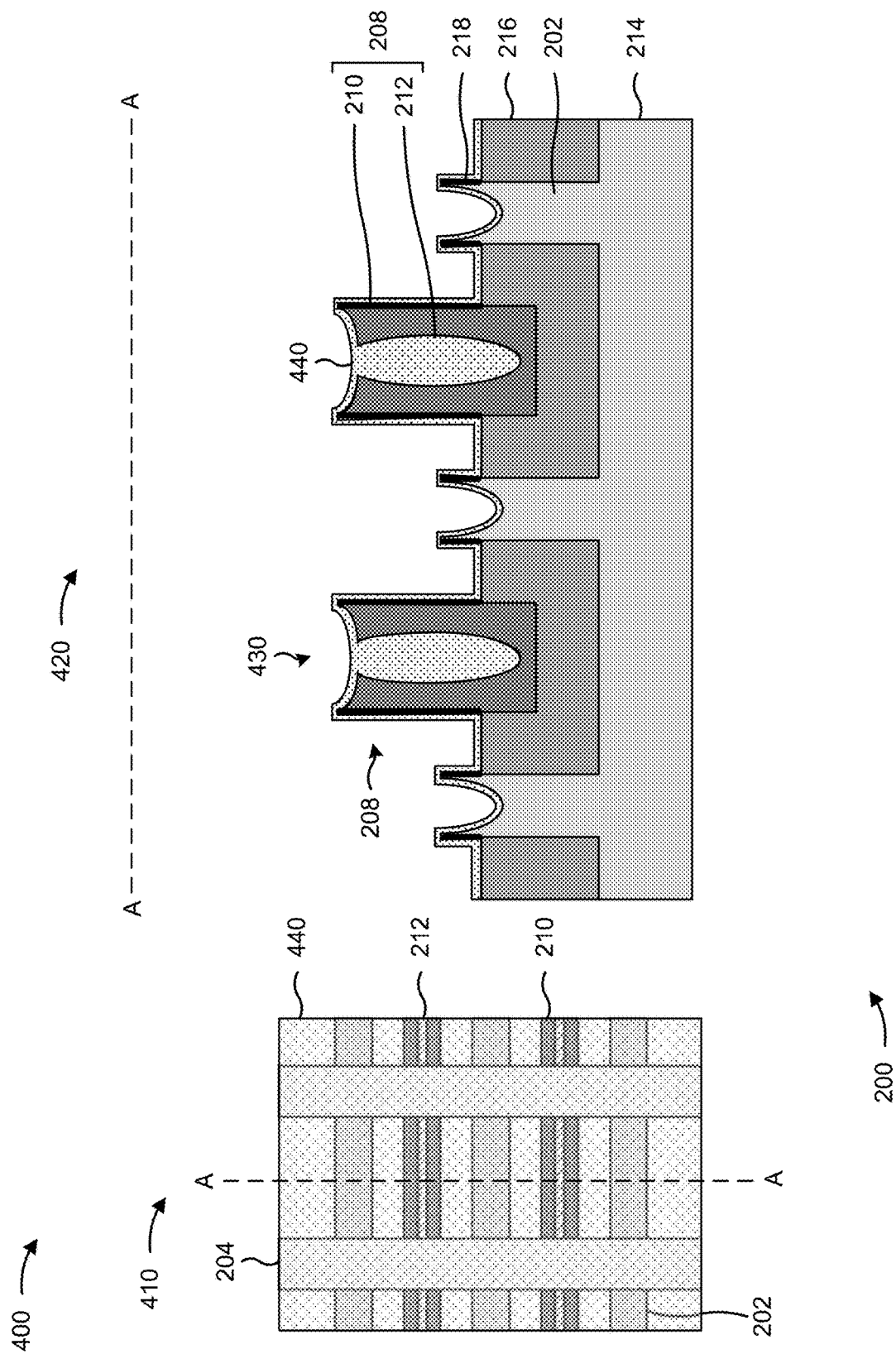

As shown in FIG. 4D, the voids 306 in the shells 210 of the dummy fins 208 are filled with a high-k dielectric material layer 440 to close the voids 306 along the length of the dummy fins 208. The deposition tool 102 deposits the high-k dielectric material layer 440 by a CVD technique, a PVD technique, an ALD technique, or another type of deposition technique described above in connection with FIG. 1. Deposition of the high-k dielectric material layer 440 in the voids 306 results in the formation of the cores 212 in the dummy fins 208. The high-k dielectric material layer 440 is deposited onto the entire top surface of the dummy fins 208 so as to completely fill the voids 306 with the high-k dielectric material layer 440.

Figure 4E:
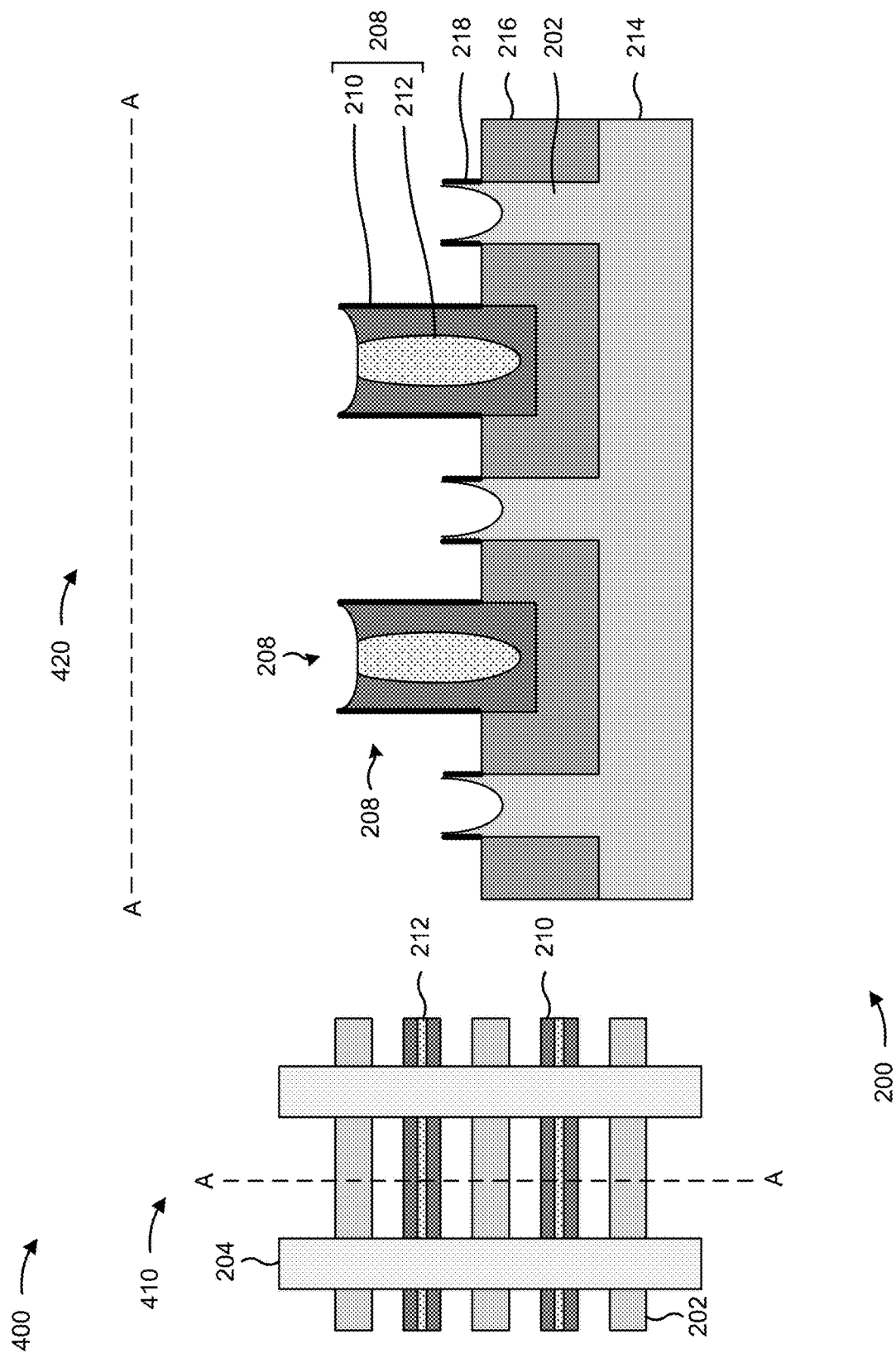

As shown in FIG. 4E, a cleaning operation is performed to remove excess or residual material of the high-k dielectric material layer 440. In some implementations, the deposition tool 102 or another semiconductor processing tool performs the cleaning operation after the deposition operation to form the high-k dielectric material layer 440. The cleaning operation includes the use of a cleaning solution to remove the excess or residual material of the high-k dielectric material layer 440 from portions of the semiconductor device 200 other than the cores 212 of the dummy fins 208. A high-temperature sulfuric acid-hydrogen peroxide mixture (HT-SPM) cleaning solution and/or another type of cleaning solution is used to remove the excess or residual material of the high-k dielectric material layer 440.

As further shown in the top-down view 410 in FIG. 4E, the cores 212 of the dummy fins 208 are surrounded by the shells 210 on three sides of the cores 212 in the portions of the semiconductor device 200 in which the dummy fins 208 are not covered by the gates 204.

Figure 4F:
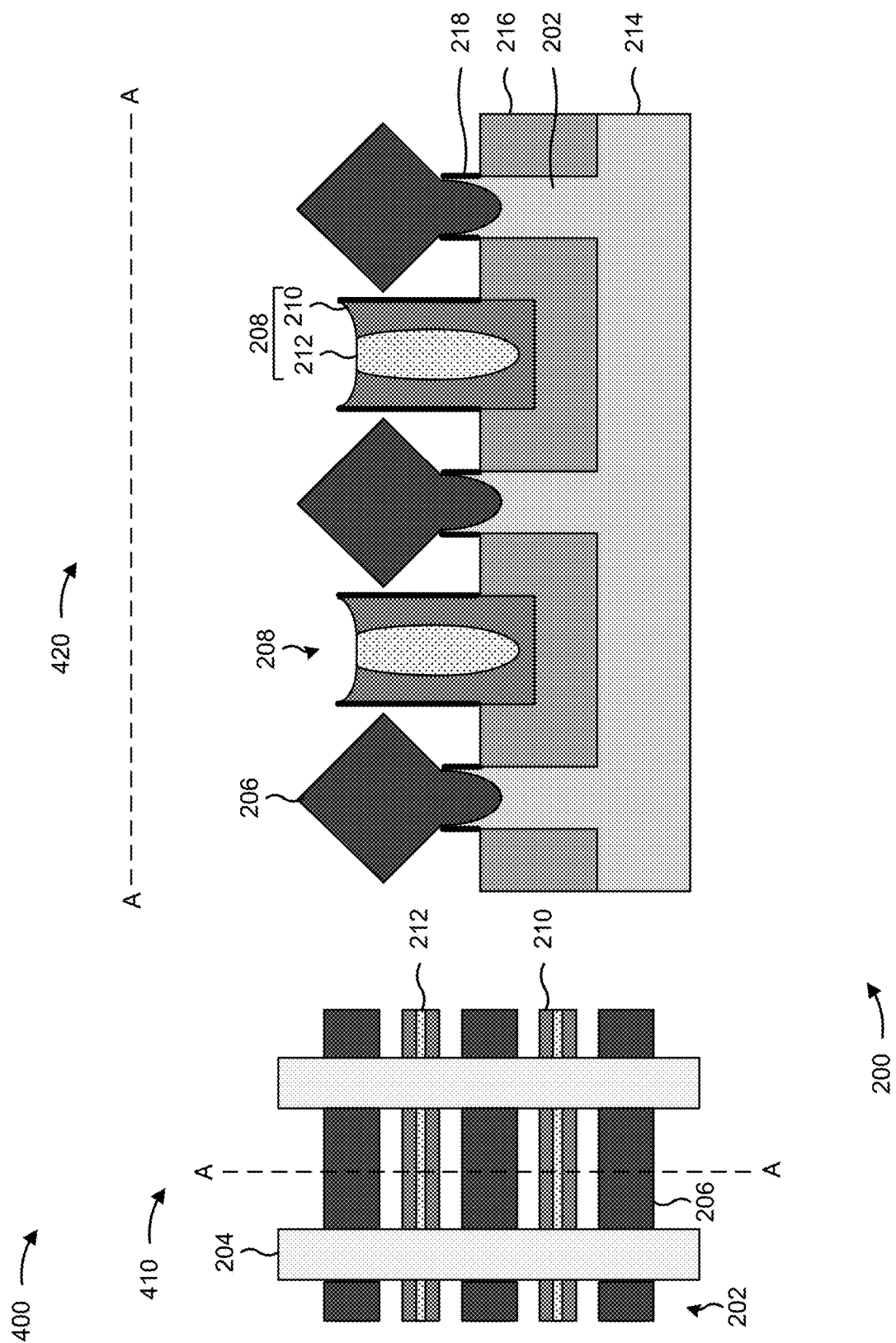

As shown in FIG. 4F, the epitaxial regions 206 are formed on the active fins 202 in portions of the semiconductor device 200 in which the active fins 202 are not covered by the gates 204. The deposition tool 102 forms the epitaxial regions 206 by an epitaxial growth operation, in which material is deposited into the recesses in the active fins 202 and grown upward from the active fins 202.

As indicated above, FIGS. 4A-4F are provided as an example. Other examples may differ from what is described with regard to FIGS. 4A-4F.

Figure 5A:
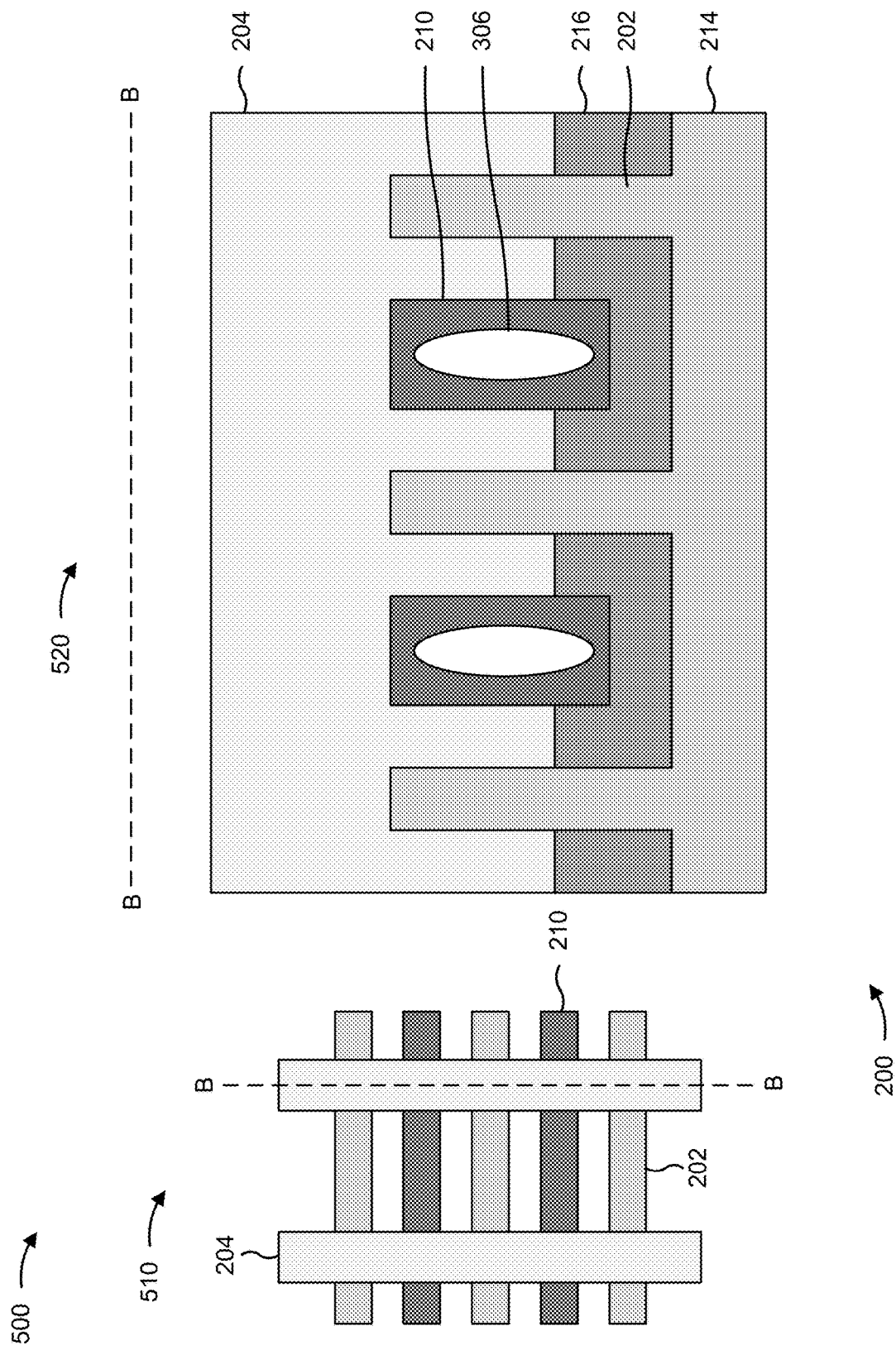
Figure 5B:
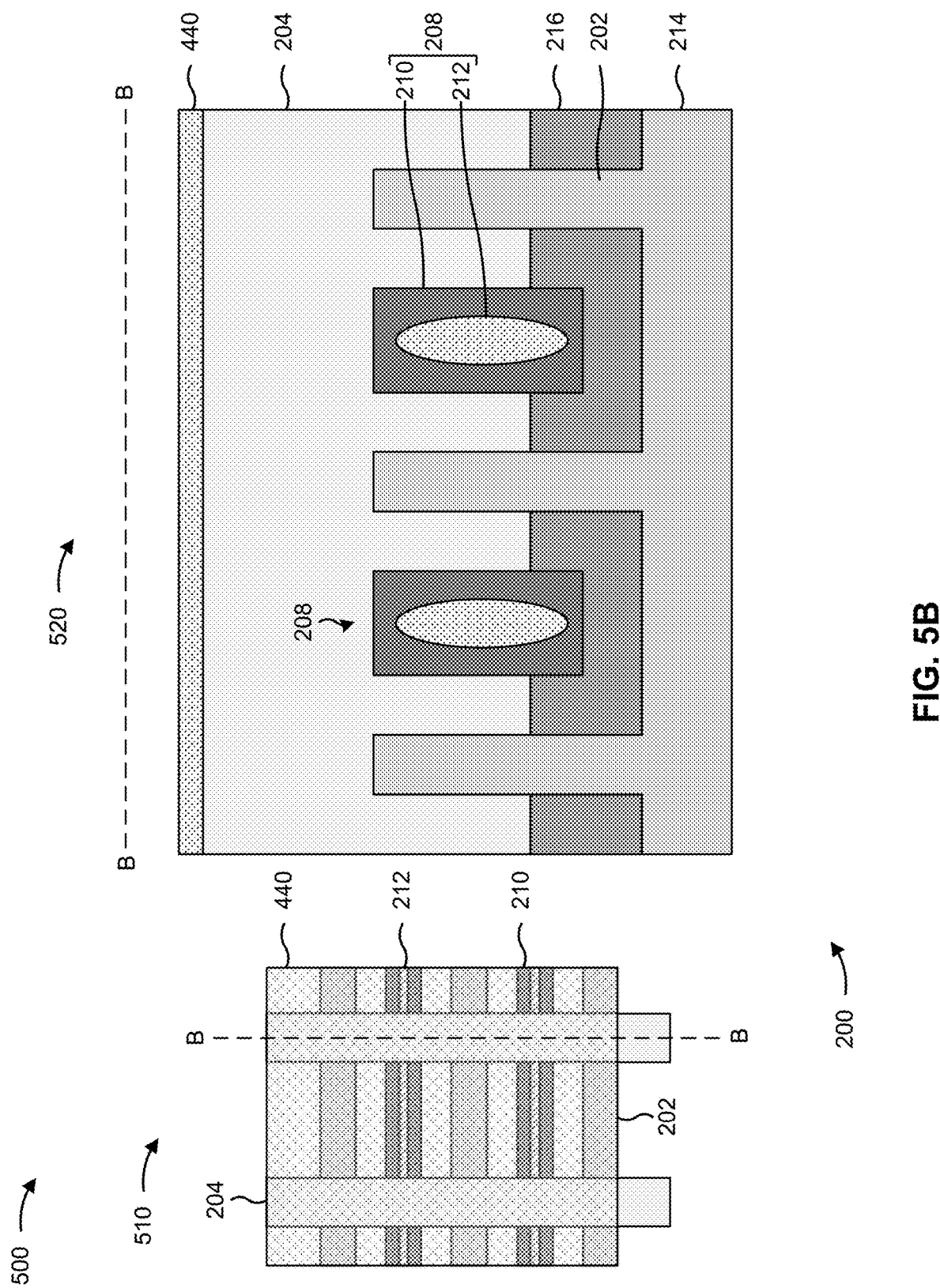
Figure 5C:
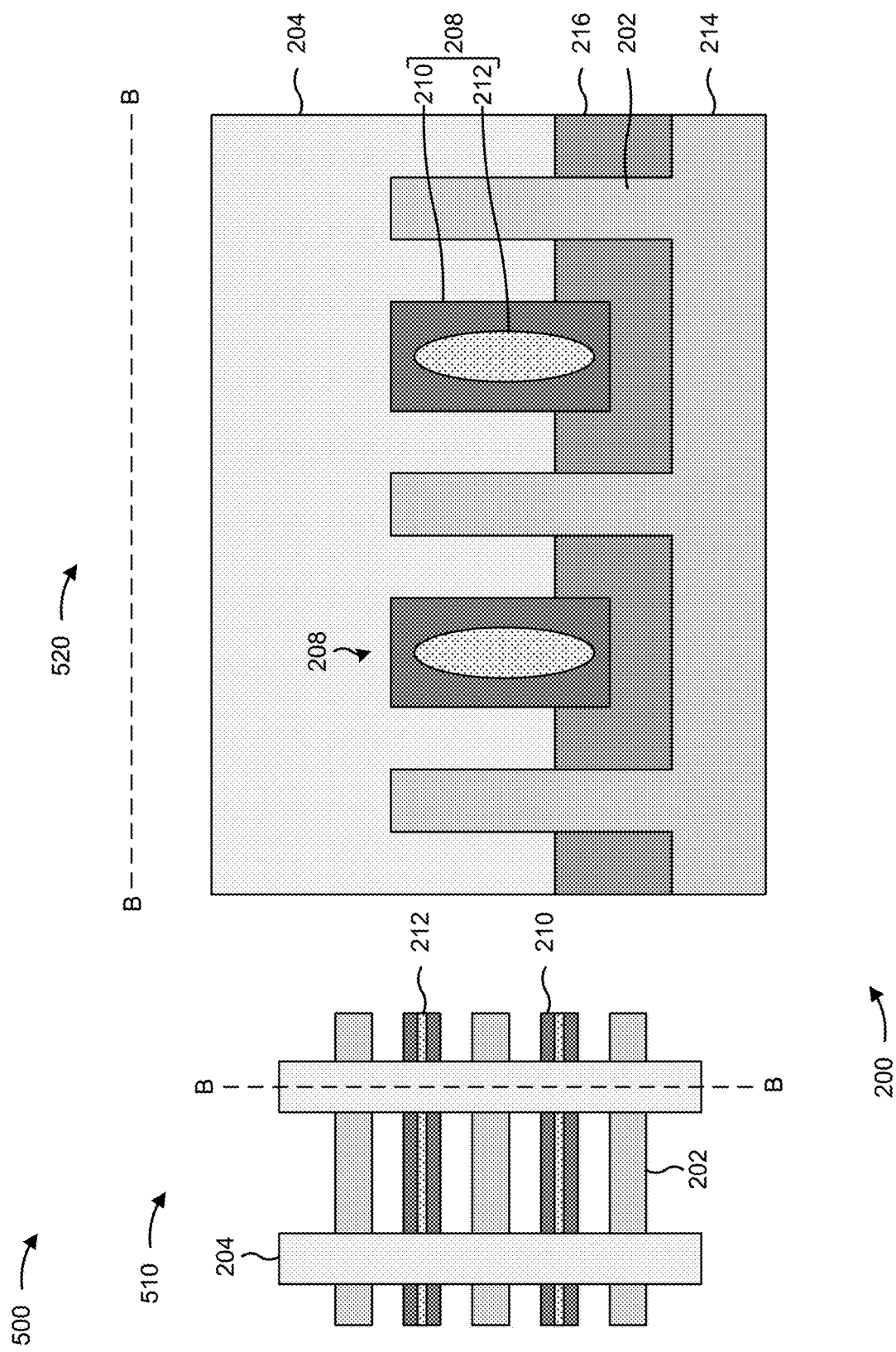

FIGS. 5A-5C are diagrams of an example implementation 500 described herein. The example implementation 500 includes an example of forming a portion of the semiconductor device 200 described herein. FIGS. 5A-5C illustrate the example implementation 500 in a top-down view 510 of the semiconductor device 200 and a cross-sectional elevation view 520 along the line BB (e.g., in a portion of the semiconductor device 200 that is covered by a gate 204).

Turning to FIG. 5A, the operations of the example implementation 500 described in connection with FIGS. 5A-5C are performed after the operations of the example implementation 300 described in connection with FIGS. 3A-3G.

Moreover, the operations of the example implementation 500 correspond to one or more operations described above in connection with the example implementation 400, except that the one or more operations as illustrated and described from the perspective along a gate 204 in the example implementation 500.

As shown in FIG. 5B, the voids 306 in the shells 210 of the dummy fins 208 under the gates 204 are filled with the high-k dielectric material layer 440 to close the voids 306 along the length of the dummy fins 208. The deposition tool 102 deposits the high-k dielectric material layer 440 by a CVD technique, a PVD technique, an ALD technique, or another type of deposition technique described above in connection with FIG. 1. The material of the high-k dielectric material layer 440 travels through the openings 430 through the shells 210 of the dummy fins 208 to form the cores 212 under the gates 204. As shown in FIG. 5B, the shells 210 of the dummy fins 208 completely surrounds the cores 212 of the dummy fins 208 on all four sides of the cores 212 in the portions of the dummy fins 208 under the gates 204.

As shown in FIG. 5C, a cleaning operation is performed to remove excess or residual material of the high-k dielectric material layer 440. In some implementations, the deposition tool 102 or another semiconductor processing tool performs the cleaning operation after the deposition operation to form the high-k dielectric material layer 440. The cleaning operation includes the use of a cleaning solution to remove the excess or residual material of the high-k dielectric material layer 440 from the gates 204 of the semiconductor device 200. An HTSPM cleaning solution and/or another type of cleaning solution is used to remove the excess or residual material of the high-k dielectric material layer 440.

As indicated above, FIGS. 5A-5C are provided as an example. Other examples may differ from what is described with regard to FIGS. 5A-5C.

Figure 6:
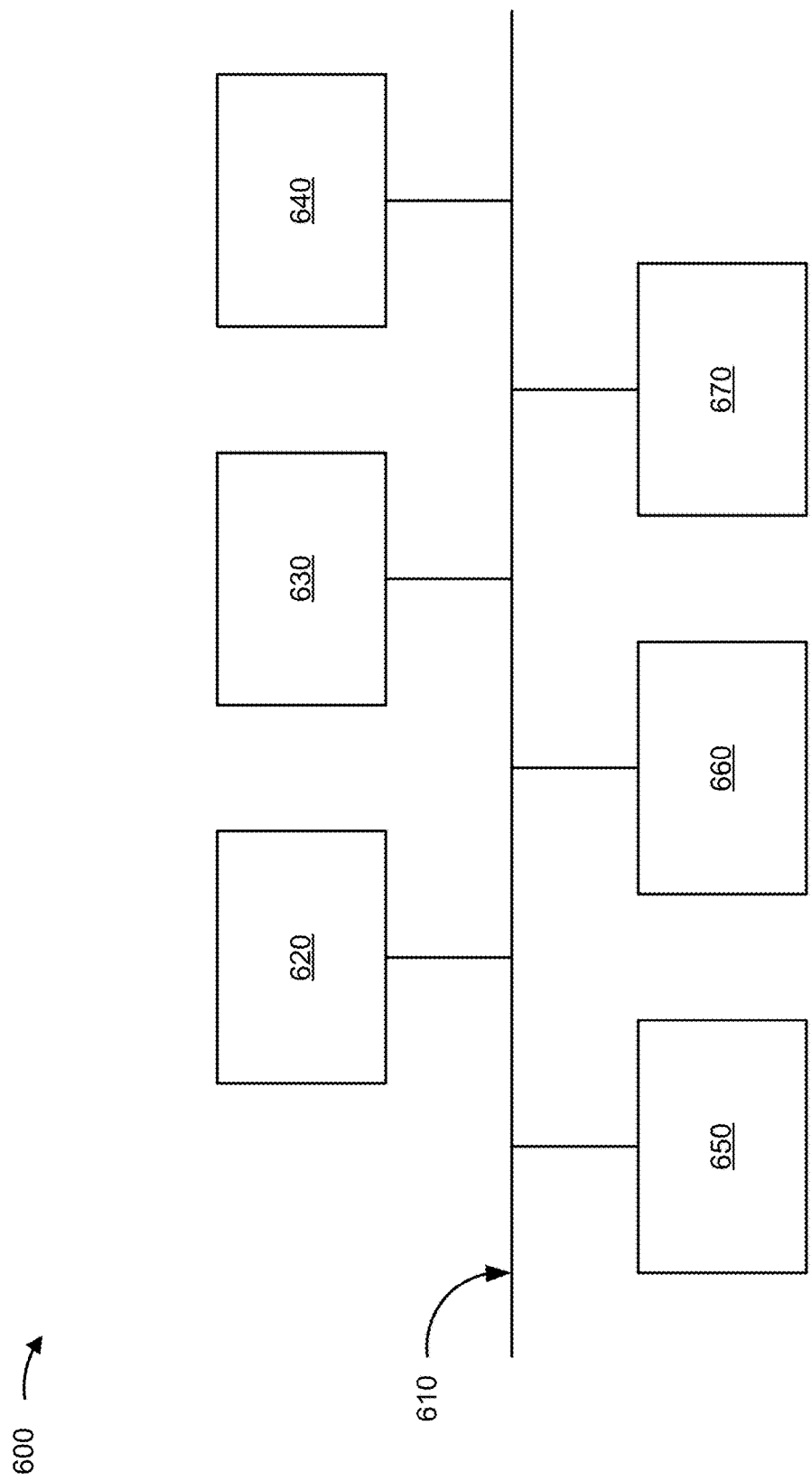
FIG. 6 is a diagram of example components of one or more devices of FIG. 1.

FIG. 6 is a diagram of example components of a device 600. In some implementations, one or more of the semiconductor processing tools 102-112 and/or the wafer/die transport tool 114 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
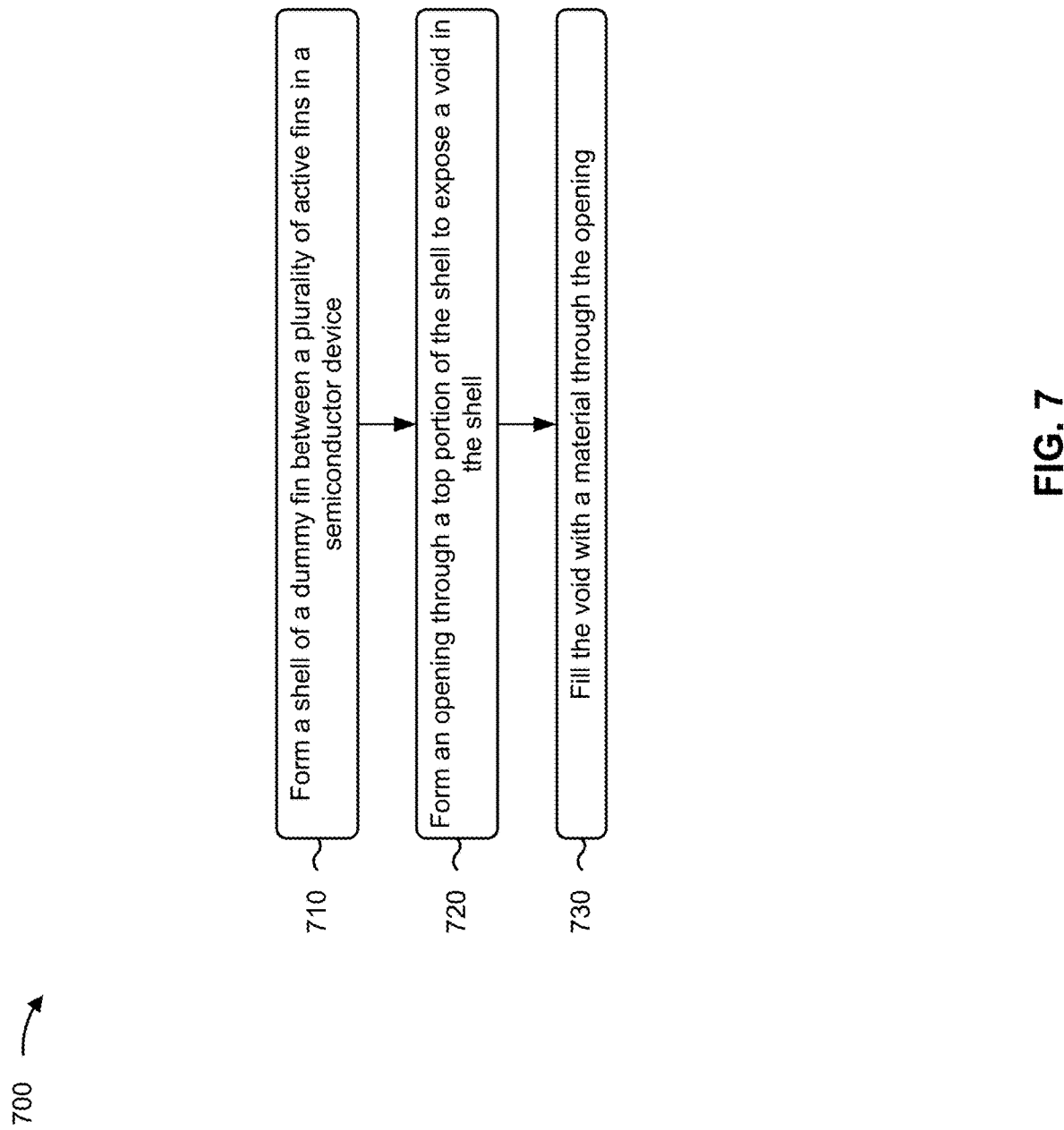
FIGS. 7 and 8 are flowcharts of example processes relating to forming a semiconductor device described herein.

FIG. 7 is a flowchart of an example process 700 associated with forming a semiconductor device. In some implementations, one or more process blocks of FIG. 7 may be performed by one or more semiconductor processing tools (e.g., one or more of the semiconductor processing tools 102-112). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include forming a shell of a dummy fin between a plurality of active fins in a semiconductor device (block 710). For example, one or more of the semiconductor processing tools 102-112 may form a shell 210 of a dummy fin 208 between a plurality of active fins 202 in a semiconductor device 200, as described above. In some implementations, the dummy fin 208 extends along a same direction as the plurality of active fins 202. In some implementations, where a top portion of the shell 210 is higher relative to top portions of the active fins 202.

As further shown in FIG. 7, process 700 may include forming an opening through a top portion of the shell to expose a void in the shell (block 720). For example, one or more of the semiconductor processing tools 102-112 may form an opening 430 through a top portion of the shell 210 to expose a void 306 in the shell 210, as described above. In some implementations, the shell 210 surrounds the void 306. In some implementations, the width of the opening 430 is less than the width of the top portion of the shell 210. In some implementations, the opening 430 is formed along a length of the dummy fin 208 in portions of the dummy fin 208 in which the shell 210 is not covered by gates 204 of the semiconductor device 200.

As further shown in FIG. 7, process 700 may include filling the void with a material through the opening (block 730). For example, one or more of the semiconductor processing tools 102-112 may fill the void 306 with a material through the opening 430, as described above.

Process 700 may include additional implementations, such as any single implementation or any combination of implementations described below and/or in connection with one or more other processes described elsewhere herein.

In a first implementation, the material includes at least one of a hafnium oxide (HfOx), a zirconium oxide (ZrOx), an aluminum oxide (AlxOy), or a lanthanum oxide (LaxOy). In a second implementation, alone or in combination with the first implementation, the shell 210 includes silicon carbon nitride (SiCN). In a third implementation, alone or in combination with one or more of the first and second implementations, forming the shell 210 includes forming the shell 210 prior to forming a gate 204 of the semiconductor device 200, and filling the void with the material includes filling the void 306 with the material after forming the gate 204.

In a fourth implementation, alone or in combination with one or more of the first through third implementations, process 700 includes forming epitaxial regions 206 on the plurality of active fins 202 after filling the void 306 with the material. In a fifth implementation, alone or in combination with one or more of the first through fourth implementations, forming the opening 430 includes forming the opening 430 in an SSD etch operation associated with the plurality of active fins 202.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
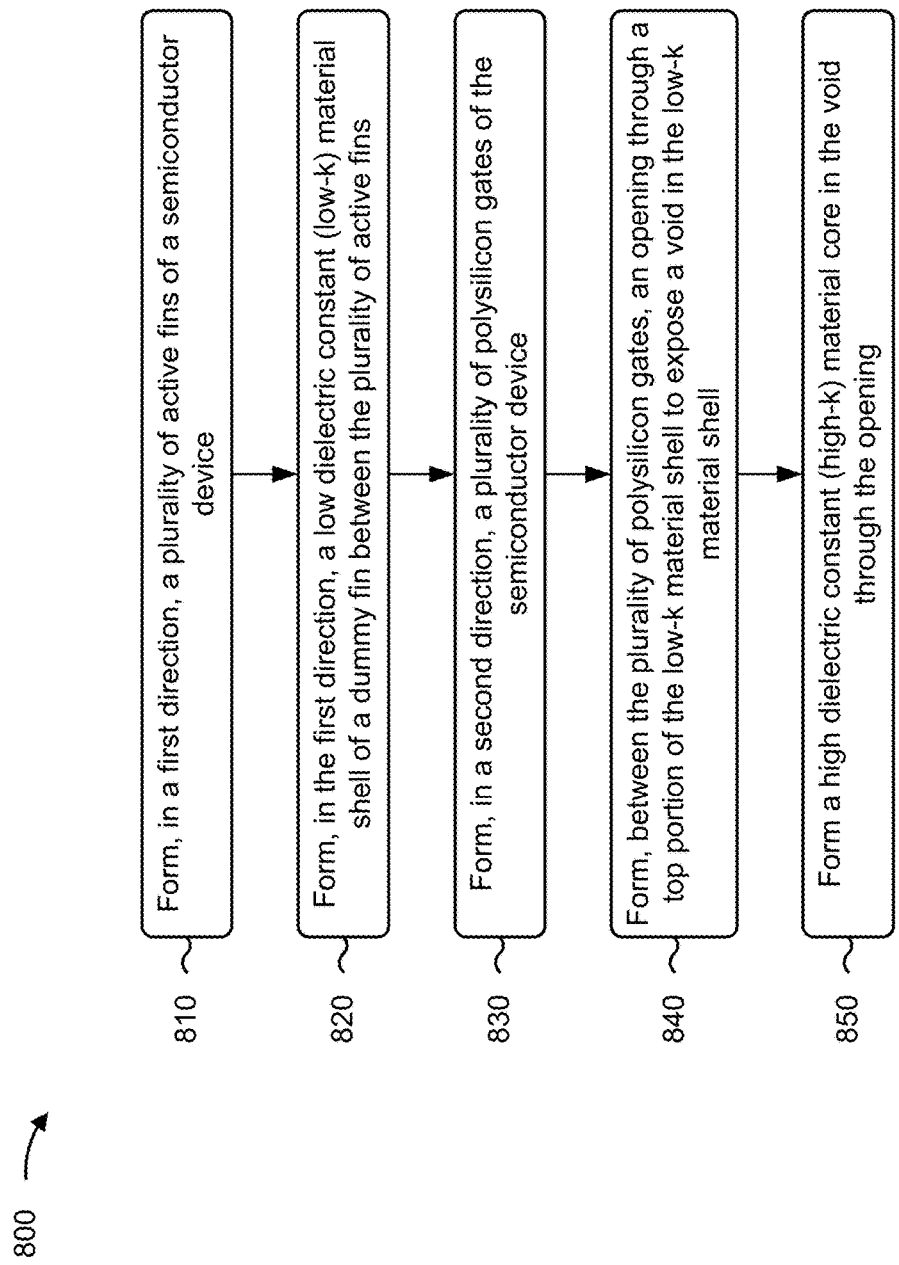

FIG. 8 is a flowchart of an example process 800 associated with forming a semiconductor device. In some implementations, one or more process blocks of FIG. 8 may be performed by one or more semiconductor processing tools (e.g., one or more of the semiconductor processing tools 102-112). Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include forming, in a first direction, a plurality of active fins of a semiconductor device (block 810). For example, one or more of the semiconductor processing tools 102-112 may form, in a first direction, a plurality of active fins 202 of a semiconductor device 200, as described above.

As further shown in FIG. 8, process 800 may include forming, in the first direction, a low-k material shell of a dummy fin between the plurality of active fins (block 820). For example, one or more of the semiconductor processing tools 102-112 may form, in the first direction, a low-k material shell 210 of a dummy fin 208 between the plurality of active fins 202, as described above.

As further shown in FIG. 8, process 800 may include forming, in a second direction, a plurality of polysilicon gates of the semiconductor device (block 830). For example, one or more of the semiconductor processing tools 102-112 may form, in a second direction, a plurality of polysilicon gates 204 of the semiconductor device 200, as described above.

As further shown in FIG. 8, process 800 may include forming, between the plurality of polysilicon gates, an opening through a top portion of the low-k material shell to expose a void in the low-k material shell (block 840). For example, one or more of the semiconductor processing tools 102-112 may form, between the plurality of polysilicon gates 204, an opening 430 through a top portion of the low-k material shell 210 to expose a void 306 in the low-k material shell 210, as described above.

As further shown in FIG. 8, process 800 may include forming a high-k material core in the void through the opening (block 850). For example, one or more of the semiconductor processing tools 102-112 may form a high-k material core 212 in the void 306 through the opening 430, as described above.

Process 800 may include additional implementations, such as any single implementation or any combination of implementations described below and/or in connection with one or more other processes described elsewhere herein.

In a first implementation, forming the high-k material core 212 in the void 306 depositing a high-k material layer 440 in the void 306 through the opening 430. In a second implementation, alone or in combination with the first implementation, process 800 includes removing remaining portions of the high-k material layer 440 from a gate spacer 218 of the semiconductor device 200 and from the plurality of polysilicon gates 204.

In a third implementation, alone or in combination with one or more of the first and second implementations, forming the high-k material core 212 in the void 306 includes forming the high-k material core 212 in portions of the void 306 under the plurality of polysilicon gates 204.

In a fourth implementation, alone or in combination with one or more of the first through third implementations, process 800 includes forming, after forming the high-k material core 212 in the void 306, a plurality of epitaxial regions 206 on the plurality of active fins 202 between the plurality of polysilicon gates 204. In a fifth implementation, alone or in combination with one or more of the first through fourth implementations, a width 224 of the high-k material core 212 is in a range of approximately 1 nanometer to approximately 3 nanometers.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a dummy fin described herein includes a low dielectric constant (low-k or LK) material outer shell. A leakage path, that would otherwise occur due to a void being formed in the low-k material outer shell, is filled with a high dielectric constant (high-k or HK) material inner core. This increases the effectiveness of the dummy fin to provide electrical isolation and increases device performance of a semiconductor device in which the dummy fin is included. Moreover, the dummy fin described herein may not suffer from bending issues experienced in other types of dummy fins, which may otherwise cause high-k induced alternating current (AC) performance degradation. The processes for forming the dummy fins described herein are compatible with other fin field effect transistor (finFET) formation processes and are be easily integrated to minimize and/or prevent polishing issues, etch back issues, and/or other types of semiconductor processing issues.

As described in greater detail above, some implementations described herein provide a semiconductor device. The semiconductor device includes a plurality of source or drain regions. The semiconductor device includes a plurality of active fins associated with the plurality of source or drain regions. The semiconductor device includes a dummy fin between the plurality of active fins, where the dummy fin includes a high-k material core a low-k material shell completely surrounding the high-k material core along at least a portion of the dummy fin.

As described in greater detail above, some implementations described herein provide a method. The method includes forming a shell of a dummy fin between a plurality of active fins in a semiconductor device. The method includes forming an opening through a top portion of the shell to expose a void in the shell, where the shell surrounds the void. The method includes filling the void with a material through the opening.

As described in greater detail above, some implementations described herein provide a method. The method includes forming, in a first direction, a plurality of active fins of a semiconductor device. The method includes forming, in the first direction, a low-k material shell of a dummy fin between the plurality of active fins. The method includes forming, in a second direction, a plurality of polysilicon gates of the semiconductor device. The method includes forming, between the plurality of polysilicon gates, an opening through a top portion of the low-k material shell to expose a void in the low-k material shell. The method includes forming a high-k material core in the void through the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a shell of a dummy fin between a plurality of active fins in a semiconductor device,
        wherein the dummy fin extends along a same direction as the plurality of active fins, and
        wherein a top portion of the shell is higher relative to top portions of the active fins;
    forming an opening through a top portion of the shell to expose a void in the shell,
        wherein the opening is formed along a length of the dummy fin in portions of the dummy fin in which the shell is not covered by gates of the semiconductor device,
        wherein a width of the opening is less than a width of the top portion, and
        wherein the shell surrounds the void; and
    filling the void with a material through the opening.

2. The method of claim 1, wherein the material comprises at least one of:
    a hafnium oxide ($HfO_x$),
    a zirconium oxide ($ZrO_x$),
    an aluminum oxide ($Al_xO_y$), or
    a lanthanum oxide ($La_xO_y$).

3. The method of claim 1, wherein the shell comprises at least one of:
    a low-k oxide,
    a low-k nitride
    a low-k carbon, or
    a low-k combination of oxide, carbon and nitride.

4. The method of claim 1, wherein forming the shell comprises:
    forming the shell prior to forming the gate of the semiconductor device; and
    wherein filling the void with the material comprises:
        filling the void with the material after forming the gate.

5. The method of claim 1, further comprising:
    forming epitaxial regions on the plurality of active fins after filling the void with the material.

6. The method of claim 1, wherein forming the opening comprises:
    forming the opening in a strained source drain (SSD) etch operation associated with the plurality of active fins.

7. A method, comprising:
    forming, in a first direction, a plurality of active fins of a semiconductor device;
    forming, in the first direction, a low dielectric constant (low-k) material shell of a dummy fin between the plurality of active fins;
    forming, in a second direction, a plurality of polysilicon gates of the semiconductor device;
    forming, between the plurality of polysilicon gates, an opening through a top portion of the low-k material shell to expose a void in the low-k material shell; and
    forming a high dielectric constant (high-k) material core in the void through the opening.

8. The method of claim 7, wherein forming the high-k material core in the void comprises:
    depositing a high-k material layer in the void through the opening.

9. The method of claim 8, further comprising:
    removing remaining portions of the high-k material layer from:
        a gate spacer of the semiconductor device, and
        the plurality of polysilicon gates.

10. The method of claim 7, wherein forming the high-k material core in the void comprises:
    forming the high-k material core in portions of the void under the plurality of polysilicon gates.

11. The method of claim 7, further comprising:
    forming, after forming the high-k material core in the void, a plurality of epitaxial regions on the plurality of active fins between the plurality of polysilicon gates.

12. The method of claim 7, wherein a width of the high-k material core is in a range of approximately 1 nanometer to approximately 3 nanometers.

* * * * *